US009728555B2

(12) United States Patent
Yamazaki

(10) Patent No.: US 9,728,555 B2
(45) Date of Patent: Aug. 8, 2017

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/926,722

(22) Filed: Oct. 29, 2015

(65) Prior Publication Data
US 2016/0071889 A1   Mar. 10, 2016

Related U.S. Application Data

(63) Continuation of application No. 13/671,858, filed on Nov. 8, 2012, now Pat. No. 9,202,923, which is a (Continued)

(30) Foreign Application Priority Data
Feb. 5, 2010  (JP) ................. 2010-024385

(51) Int. Cl.
*H01L 27/12* (2006.01)
*H01L 21/02* (2006.01)
(Continued)

(52) U.S. Cl.
CPC .... *H01L 27/1225* (2013.01); *H01L 21/02554* (2013.01); *H01L 21/02565* (2013.01);
(Continued)

(58) Field of Classification Search
CPC ............... H01L 27/1225; H01L 29/786; H01L 29/0657; H01L 29/7869; H01L 21/02554; H01L 29/1033; H01L 29/66742
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2086013 A | 8/2009 |

(Continued)

OTHER PUBLICATIONS

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
(Continued)

*Primary Examiner* — Nathan W Ha
(74) *Attorney, Agent, or Firm* — Eric J. Robinson; Robinson Intellectual Property Law Office, P.C.

(57) ABSTRACT

A more convenient and highly reliable semiconductor device which has a transistor including an oxide semiconductor with higher impact resistance used for a variety of applications is provided. A semiconductor device has a bottom-gate transistor including a gate electrode layer, a gate insulating layer, and an oxide semiconductor layer over a substrate, an insulating layer over the transistor, and a conductive layer over the insulating layer. The insulating layer covers the oxide semiconductor layer and is in contact with the gate insulating layer. In a channel width direction of the oxide semiconductor layer, end portions of the gate insulating
(Continued)

layer and the insulating layer are aligned with each other over the gate electrode layer, and the conductive layer covers a channel formation region of the oxide semiconductor layer and the end portions of the gate insulating layer and the insulating layer and is in contact with the gate electrode layer.

36 Claims, 11 Drawing Sheets

Related U.S. Application Data continuation of application No. 13/613,413, filed on Sep. 13, 2012, now Pat. No. 8,674,354, which is a continuation of application No. 13/014,036, filed on Jan. 26, 2011, now Pat. No. 8,274,079.

(51) Int. Cl.
*H01L 29/66* (2006.01)
*H01L 29/786* (2006.01)
*H01L 29/10* (2006.01)
*H01L 29/24* (2006.01)

(52) U.S. Cl.
CPC .... *H01L 21/02631* (2013.01); *H01L 27/1266* (2013.01); *H01L 29/1033* (2013.01); *H01L 29/24* (2013.01); *H01L 29/66742* (2013.01); *H01L 29/66969* (2013.01); *H01L 29/7869* (2013.01); *H01L 29/78606* (2013.01)

(58) Field of Classification Search
USPC .......................................................... 257/59
See application file for complete search history.

(56) References Cited

U.S. PATENT DOCUMENTS

| | | |
|---|---|---|
| 6,294,274 B1 | 9/2001 | Kawazoe et al. |
| 6,310,670 B1 | 10/2001 | Lee |
| 6,476,418 B1 | 11/2002 | Shiga et al. |
| 6,563,174 B2 | 5/2003 | Kawasaki et al. |
| 6,727,522 B1 | 4/2004 | Kawasaki et al. |
| 6,794,682 B2 | 9/2004 | Watanabe et al. |
| 6,858,478 B2 | 2/2005 | Chau et al. |
| 6,914,295 B2 | 7/2005 | Chau et al. |
| 6,946,361 B2 | 9/2005 | Takayama et al. |
| 6,972,467 B2 | 12/2005 | Zhang et al. |
| 7,005,366 B2 | 2/2006 | Chau et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,392 B2 | 9/2006 | Isobe et al. |
| 7,105,868 B2 | 9/2006 | Nause et al. |
| 7,148,092 B2 | 12/2006 | Isobe et al. |
| 7,211,825 B2 | 5/2007 | Shih et al |
| 7,250,627 B2 * | 7/2007 | Hoffman ............ H01L 29/7869 257/59 |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,358,121 B2 | 4/2008 | Chau et al. |
| 7,361,573 B2 | 4/2008 | Takayama et al. |
| 7,368,791 B2 | 5/2008 | Zhang et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,427,794 B2 | 9/2008 | Chau et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,504,678 B2 | 3/2009 | Chau et al. |
| 7,514,346 B2 | 4/2009 | Chau et al. |
| 7,521,715 B2 | 4/2009 | Jang et al. |
| 7,531,837 B2 | 5/2009 | Liu |
| 7,560,756 B2 | 7/2009 | Chau et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,732,847 B2 | 6/2010 | Tanaka et al. |
| 7,737,506 B2 | 6/2010 | Isobe et al. |
| 7,749,818 B2 | 7/2010 | Isobe et al. |
| 7,795,734 B2 | 9/2010 | Isobe et al. |
| 7,872,722 B2 | 1/2011 | Kimura |
| 7,994,500 B2 | 8/2011 | Kim et al. |
| 8,058,645 B2 | 11/2011 | Jeong et al. |
| 8,148,779 B2 | 4/2012 | Jeong et al. |
| 8,164,152 B2 | 4/2012 | Lee et al. |
| 8,188,480 B2 | 5/2012 | Itai |
| 8,202,365 B2 | 6/2012 | Umeda et al. |
| 8,203,143 B2 | 6/2012 | Imai |
| 8,203,144 B2 | 6/2012 | Hoffman et al. |
| 8,207,531 B2 | 6/2012 | Takahashi et al. |
| 8,274,079 B2 | 9/2012 | Yamazaki |
| 8,330,155 B2 | 12/2012 | Jeon et al. |
| 8,354,674 B2 | 1/2013 | Kimura |
| 8,373,237 B2 | 2/2013 | Park et al. |
| 8,384,076 B2 | 2/2013 | Park et al. |
| 8,384,077 B2 | 2/2013 | Yano et al. |
| 8,413,805 B2 | 4/2013 | Bray et al. |
| 8,513,661 B2 | 8/2013 | Takahashi et al. |
| 8,586,979 B2 | 11/2013 | Son et al. |
| 8,647,031 B2 | 2/2014 | Hoffman et al. |
| 8,664,644 B2 | 3/2014 | Nathan et al. |
| 8,674,354 B2 | 3/2014 | Yamazaki |
| 8,785,240 B2 | 7/2014 | Watanabe |
| 8,878,180 B2 | 11/2014 | Yamazaki |
| 8,981,369 B2 | 3/2015 | Yano et al. |
| 9,202,923 B2 | 12/2015 | Yamazaki |
| 2001/0030323 A1 | 10/2001 | Ikeda |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0029310 A1 | 2/2004 | Bernds et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199880 A1 * | 9/2005 | Hoffman ............ H01L 29/7869 257/72 |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 * | 6/2006 | Kumomi ........... H01L 27/14621 257/57 |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118869 A1 | 6/2006 | Lan et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |

(56) References Cited

U.S. PATENT DOCUMENTS

| | | |
|---|---|---|
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0136990 A1 | 6/2008 | Kimura |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0180045 A1* | 7/2009 | Yoon .............. G02F 1/1368 349/43 |
| 2009/0184315 A1* | 7/2009 | Lee .............. H01L 27/1296 257/43 |
| 2009/0206332 A1* | 8/2009 | Son .............. H01L 29/42384 257/43 |
| 2009/0224254 A1 | 9/2009 | Lee et al. |
| 2009/0224754 A1 | 9/2009 | Lamarre et al. |
| 2009/0230004 A1 | 9/2009 | Bray et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0006835 A1 | 1/2010 | Yoon et al. |
| 2010/0039602 A1 | 2/2010 | Yamazaki et al. |
| 2010/0051935 A1 | 3/2010 | Lee et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0123128 A1 | 5/2010 | Jeon et al. |
| 2010/0193785 A1 | 8/2010 | Kimura |
| 2010/0219411 A1 | 9/2010 | Hoffman et al. |
| 2010/0320458 A1 | 12/2010 | Umeda et al. |
| 2010/0320459 A1 | 12/2010 | Umeda et al. |
| 2011/0049509 A1 | 3/2011 | Takahashi et al. |
| 2011/0193083 A1 | 8/2011 | Kim et al. |
| 2012/0119205 A1 | 5/2012 | Taniguchi et al. |
| 2012/0205651 A1 | 8/2012 | Lee et al. |
| 2013/0248393 A1 | 9/2013 | Bray et al. |

FOREIGN PATENT DOCUMENTS

| | | | |
|---|---|---|---|
| EP | 2120267 A | 11/2009 | |
| EP | 2226847 A | 9/2010 | |
| EP | 2408011 A | 1/2012 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-048087 A | 2/1993 | |
| JP | 05-251705 A | 9/1993 | |
| JP | 05-326956 A | 12/1993 | |
| JP | 06-021455 A | 1/1994 | |
| JP | 07-114347 A | 5/1995 | |
| JP | 08-264794 A | 10/1996 | |
| JP | 11-505377 | 5/1999 | |
| JP | 2000-026119 A | 1/2000 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2002-368229 A | 12/2002 | |
| JP | 2003-037268 A | 2/2003 | |
| JP | 2003-086000 A | 3/2003 | |
| JP | 2003-086808 A | 3/2003 | |
| JP | 2004-507096 | 3/2004 | |
| JP | 2004-103957 A | 4/2004 | |
| JP | 2004-273614 A | 9/2004 | |
| JP | 2004-273732 A | 9/2004 | |
| JP | 2005-166713 A | 6/2005 | |
| JP | 2006-171136 A | 6/2006 | |
| JP | 2007-096055 A | 4/2007 | |
| JP | 2007-123861 A | 5/2007 | |
| JP | 2008-270259 A | 11/2008 | |
| JP | 2008-281988 A | 11/2008 | |
| JP | 2009-010431 A | 1/2009 | |
| JP | 2009-033145 A | 2/2009 | |
| JP | 2009-099847 A | 5/2009 | |
| JP | 2009-167087 A | 7/2009 | |
| JP | 2009-176865 A | 8/2009 | |
| JP | 2009-231613 A | 10/2009 | |
| JP | 2009-278115 A | 11/2009 | |
| JP | 2010-016347 A | 1/2010 | |
| JP | 4415062 | 2/2010 | |
| JP | 2010-067954 A | 3/2010 | |
| JP | 2010-177431 A | 8/2010 | |
| JP | 4571221 | 10/2010 | |
| KR | 2000-0055883 A | 9/2000 | |
| KR | 2006-0132720 A | 12/2006 | |
| KR | 10-0667090 | 1/2007 | |
| KR | 2007-0006770 A | 1/2007 | |
| KR | 2007-0096055 A | 10/2007 | |
| KR | 2006-0052107 A | 6/2008 | |
| KR | 10-0884053 | 2/2009 | |
| KR | 2009-0084642 A | 8/2009 | |
| KR | 10-1399609 | 5/2014 | |
| TW | 359882 | 6/1999 | |
| TW | 416151 | 12/2000 | |
| TW | 200306009 | 11/2003 | |
| TW | 200414538 | 8/2004 | |
| TW | 200527657 | 8/2005 | |
| TW | 200535947 | 11/2005 | |
| TW | 200743213 | 11/2007 | |
| TW | 200910468 | 3/2009 | |
| TW | 201001710 | 1/2010 | |
| TW | I357613 | 2/2012 | |
| WO | WO-2004/019414 | 3/2004 | |
| WO | WO-2004/114391 | 12/2004 | |
| WO | WO-2005/093847 | 10/2005 | |
| WO | WO-2005/093850 | 10/2005 | |
| WO | WO-2005/093851 | 10/2005 | |
| WO | WO-2006/060521 | 6/2006 | |
| WO | WO-2006/079799 | 8/2006 | |
| WO | WO-2007/110940 | 10/2007 | |
| WO | WO-2008/126879 | 10/2008 | |
| WO | WO-2008/133345 | 11/2008 | |
| WO | WO-2009/075281 | 6/2009 | |
| WO | WO-2009/093722 | 7/2009 | |
| WO | WO-2011/096263 | 8/2011 | |

OTHER PUBLICATIONS

International Search Report (Application No. PCT/JP2011/050612) Dated Feb. 15, 2011.

(56) References Cited

OTHER PUBLICATIONS

Written Opinion (Application No. PCT/JP2011/050612) Dated Feb. 15, 2011.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3: Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT",

(56) References Cited

OTHER PUBLICATIONS

SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th Interational Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Appied Physics Letters), Sep. 1, 2003, vol. 83, No. 9, pp. 1755-1757.
Taiwanese Office Action (Application No. 102124907) Dated Apr. 20, 2015.
Taiwanese Office Action (Application No. 102124905) Dated Jun. 18, 2015.
Taiwanese Office Action (Application No. 102124906) Dated Sep. 1, 2015.
Korean Office Action (Application No. 2014-7034600) Dated Dec. 18, 2015.
Korean Office Action (Application No. 2014-7034600) Dated Jun. 29, 2016.
Taiwanese Office Action (Application No. 105119962) Dated Dec. 6, 2016.
Korean Office Action (Application No. 2012-7022784) Dated Feb. 20, 2017.

\* cited by examiner channel length (L) direction channel width (W) direction

FIG. 3A1
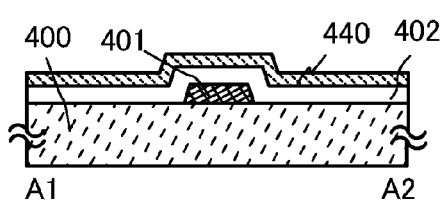
FIG. 3A2
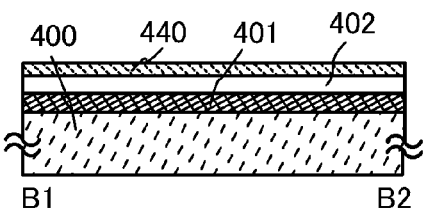
FIG. 3B1
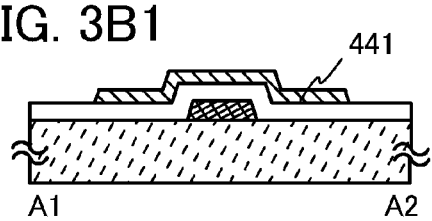
FIG. 3B2
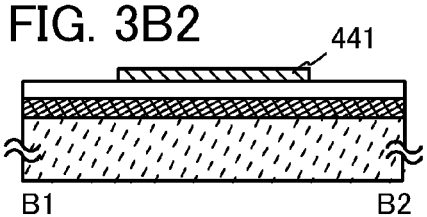
FIG. 3C1
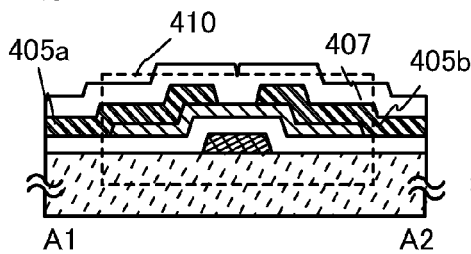
FIG. 3C2
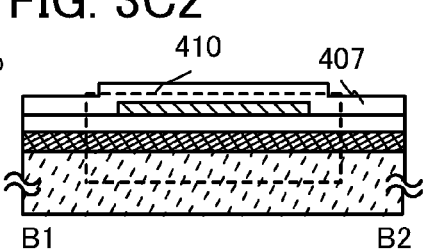
FIG. 3D1
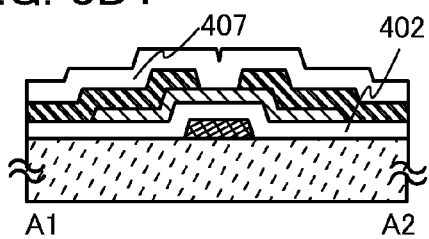
FIG. 3D2
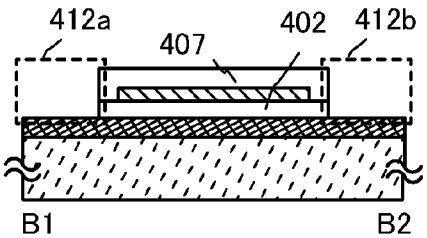
FIG. 3E1
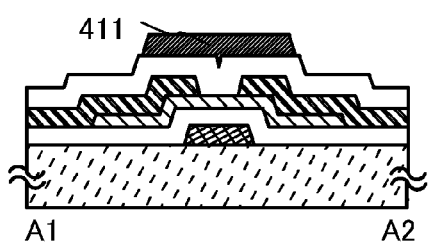
FIG. 3E2
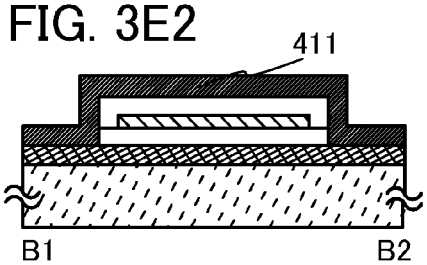

channel length (L) direction channel width (W) direction

SEMICONDUCTOR DEVICE AND METHOD FOR MANUFACTURING THE SAME

TECHNICAL FIELD

The present invention relates to a semiconductor device and a method for manufacturing the semiconductor device.

In this specification, a semiconductor device generally means a device which can function by utilizing semiconductor characteristics, and an electro-optic device, a semiconductor circuit, and an electronic device are all semiconductor devices.

BACKGROUND ART

A technique for forming a thin film transistor (TFT) with the use of a semiconductor thin film formed over a substrate having an insulating surface has attracted attention. A thin film transistor is applied to a wide range of electronic devices such as an integrated circuit (IC) or an image display device (display device).

As a material having semiconductor characteristics suitable for thin film transistors, a metal oxide has attracted attention, and thin film transistors in which a channel formation region is formed using such a metal oxide having semiconductor characteristics are known (see Patent Documents 1 and 2).

In addition, electronic devices with the use of thin film transistors have been used in a variety of places for a variety of applications and thus have been required to have various characteristics and shapes such as light weight, thinness, and impact resistance. Accordingly, electronic devices having functions for serving their intended purposes have been developed.

For example, as a semiconductor device which is provided for an amusement machine, a display whose display surface is curved so that players can experience stereoscopic effect has been reported (e.g., see Patent Document 3).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. H7-114347

DISCLOSURE OF INVENTION

When semiconductor devices have a variety of shapes as described above, the semiconductor devices need to have high resistance to external impact.

In view of the above, it is an object of an embodiment of the present invention to provide a more highly impact-resistant semiconductor device including a transistor in which an oxide semiconductor is used.

Further, it is an object of an embodiment of the present invention to provide a more convenient and highly reliable semiconductor device which can be used for a variety of applications.

According to an embodiment of the invention disclosed in this specification, a semiconductor device includes a bottom-gate transistor including a gate electrode layer, a gate insulating layer, and an oxide semiconductor layer over a substrate, an insulating layer over the bottom-gate transistor, and a conductive layer over the insulating layer. The insulating layer is provided so as to cover the oxide semiconductor layer and be in contact with the gate insulating layer. In a direction of the channel width of the oxide semiconductor layer, an end portion of the gate insulating layer and an end portion of the insulating layer are aligned with each other over the gate electrode layer, and the conductive layer is provided so as to cover a channel formation region of the oxide semiconductor layer, the end portion of the gate insulating layer, and the end portion of the insulating layer and be in contact with the gate electrode layer.

According to an embodiment of the invention disclosed in this specification, a semiconductor device includes a driver circuit portion including a bottom-gate transistor for a driver circuit and a pixel portion including a transistor for a pixel over one substrate. The bottom-gate transistor for a driver circuit includes a gate electrode layer, a gate insulating layer, and an oxide semiconductor layer, an insulating layer is provided over the oxide semiconductor layer, and a conductive layer is provided over the insulating layer. The insulating layer is provided so as to cover the oxide semiconductor layer and be in contact with the gate insulating layer. In a direction of the channel width of the oxide semiconductor layer, an end portion of the gate insulating layer and an end portion of the insulating layer are aligned with each other over the gate electrode layer, and the conductive layer is provided so as to cover a channel formation region of the oxide semiconductor layer, the end portion of the gate insulating layer, and the end portion of the insulating layer and be in contact with the gate electrode layer.

In the above structure, a source electrode layer and a drain electrode layer may be provided between the oxide semiconductor layer and the insulating layer or between the gate insulating layer and the oxide semiconductor layer.

In the above structure, in the channel width direction, the channel formation region of the oxide semiconductor layer is surrounded by the gate insulating layer and the insulating layer which are stacked below and over the oxide semiconductor layer and also by the gate electrode layer and the conductive layer; thus, the semiconductor device is highly impact-resistant and can have a variety of shapes by using a flexible substrate as the substrate.

When a transistor including an oxide semiconductor layer is provided over a flexible substrate, a flexible semiconductor device can be manufactured.

A transistor including an oxide semiconductor layer may be directly formed over a flexible substrate. Alternatively, a transistor including an oxide semiconductor layer may be formed over a manufacturing substrate, and then, the transistor may be separated and transferred to a flexible substrate. Note that in order to separate the transistor from the manufacturing substrate and transfer it to the flexible substrate, a separation layer may be provided between the manufacturing substrate and the transistor including the oxide semiconductor layer.

According to an embodiment of the invention disclosed in this specification, a method for manufacturing a semiconductor device includes: forming a gate electrode layer over a flexible substrate, forming a gate insulating layer over the gate electrode layer, forming an oxide semiconductor layer over the gate insulating layer, forming an insulating layer so as to cover the oxide semiconductor layer, forming an opening in the gate insulating layer and the insulating layer so as to expose the gate electrode layer, and forming a conductive layer so as to cover a top portion of a stack including the gate insulating layer and the insulating layer and cover an end portion of the stack including the gate insulating layer and the insulating layer and be in contact with the gate electrode layer at the opening.

According to an embodiment of the invention disclosed in this specification, a method for manufacturing a semiconductor device includes: forming a separation layer over a manufacturing substrate, forming a gate electrode layer over the separation layer, forming a gate insulating layer over the gate electrode layer, forming an oxide semiconductor layer over the gate insulating layer, forming an insulating layer so as to cover the oxide semiconductor layer, forming an opening in the gate insulating layer and the insulating layer so as to expose the gate electrode layer, forming a conductive layer so as to cover a top portion of a stack including the gate insulating layer and the insulating layer and cover an end portion of the stack including the gate insulating layer and the insulating layer and be in contact with the gate electrode layer at the opening to form a transistor, transferring the transistor from the manufacturing substrate to a supporting substrate by using the separation layer, and transferring the transistor that is transferred to the supporting substrate to a flexible substrate.

Note that the ordinal numbers such as "first" and "second" in this specification are used for convenience and do not denote the order of steps and the stacking order of layers. In addition, in this specification, the ordinal numbers do not denote particular names which specify the invention.

According to an embodiment of the present invention, in a channel width direction, a channel formation region of an oxide semiconductor layer is surrounded by a gate insulating layer and an insulating layer which are stacked and also by a gate electrode layer and a conductive layer; thus, a semiconductor device can be impact-resistant.

According to an embodiment of the present invention, by being formed to be flexible, a semiconductor device can be used for a variety of applications, and a more convenient and highly reliable semiconductor device can be provided.

BRIEF DESCRIPTION OF DRAWINGS

FIGS. 3A1 to 3E2 illustrate an embodiment of a method for manufacturing a semiconductor device.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to the description of the embodiments below.

Embodiment 1

In this embodiment, an embodiment of a semiconductor device and a method for manufacturing the semiconductor device will be described with reference to FIGS. 1A to 1C and FIGS. 3A1 to 3E2. In this embodiment, a transistor will be described as an example of the semiconductor device. Note that an oxide semiconductor layer is preferable for use as a semiconductor layer in a semiconductor device disclosed in this specification.

Figure 1A:
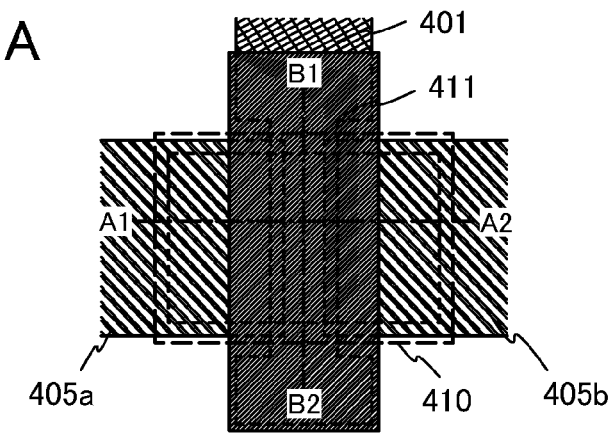
FIGS. 1A to 1C illustrate an embodiment of a semiconductor device.
Figure 1B:
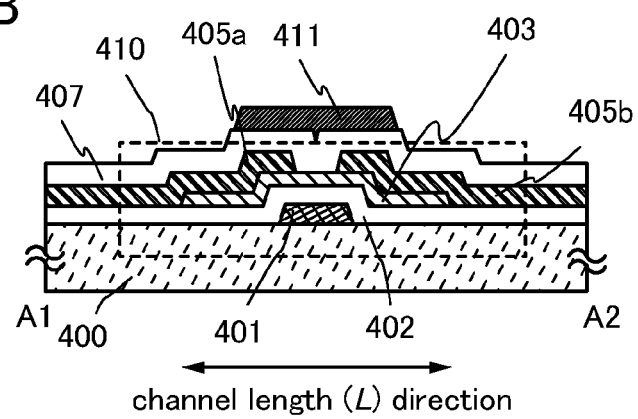
Figure 1C:
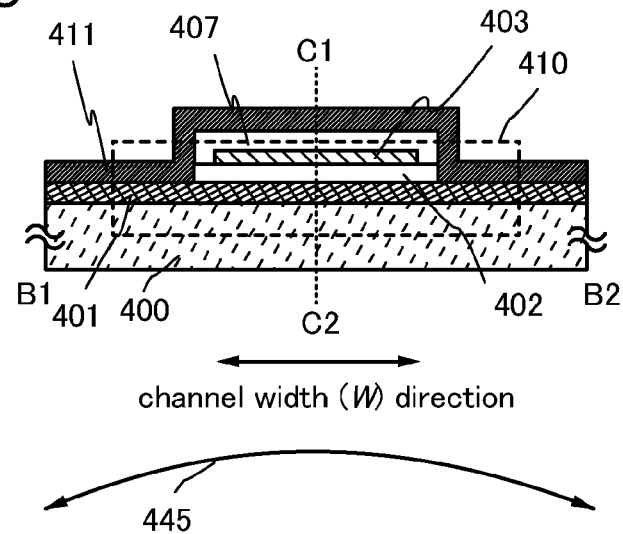

As illustrated in FIGS. 1A to 1C, a channel formation region of an oxide semiconductor layer 403 in a transistor 410 has a channel length (L) direction and a channel width (W) direction.

FIG. 1A is a plan view of the transistor 410, FIG. 1B is a cross-sectional view of the transistor 410 illustrated in FIG. 1A along line A1-A2 in the channel length (L) direction, and FIG. 1C is a cross-sectional view along line B1-B2 in the channel width (W) direction.

As illustrated in FIGS. 1A to 1C, the transistor 410 includes, over a substrate 400 having an insulating surface, a gate electrode layer 401, a gate insulating layer 402, the oxide semiconductor layer 403, a source electrode layer 405a, and a drain electrode layer 405b. An insulating layer 407 and a conductive layer 411 are stacked in this order over the transistor 410.

In the cross-sectional view in the channel width direction in FIG. 1C, the insulating layer 407 and the gate insulating layer 402 cover a top portion, a bottom portion, and end portions of the oxide semiconductor layer 403 so as to surround the oxide semiconductor layer 403 and are in contact with each other at opposite end portions of the oxide semiconductor layer 403. The gate electrode layer 401 is provided below the gate insulating layer 402, and the conductive layer 411 is provided over the insulating layer 407 so as to cover top portions of the oxide semiconductor layer 403, the gate insulating layer 402, and the insulating layer 407 and opposite end portions of the gate insulating layer 402 and the insulating layer 407. Moreover, the conductive layer 411 is in contact with the gate electrode layer 401.

In the above manner, in the channel width direction, the oxide semiconductor layer 403 is surrounded by the gate insulating layer 402 and the insulating layer 407, and also by the gate electrode layer 401 and the conductive layer 411.

With the structure as described above in which the periphery of the oxide semiconductor layer 403 is protected by a stack including the gate electrode layer, the gate insulating layer, the insulating layer, and the conductive layer, even when force (external force) is applied in the channel width (W) direction as indicated by an arrow 445 in FIG. 1C, the thick stack structure is unlikely to be bent, so that force applied to the oxide semiconductor layer 403 which is at the center of the stack can be reduced. Accordingly, the oxide semiconductor layer 403 can be prevented from being broken owing to external impact.

In addition, an opening where the gate electrode layer 401 is exposed widely is formed in the gate insulating layer 402 and the insulating layer 407, and the gate electrode layer 401 and the conductive layer 411 are in contact with each other at the opening. By using a conductive film with high adhesion for each of the gate electrode layer 401 and the conductive layer 411, the gate electrode layer 401, the gate insulating layer 402, the oxide semiconductor layer 403, the insulating layer 407, and the conductive layer 411 can be prevented from peeling at the interface thereof owing to the force indicated by the arrow 445.

In order to increase adhesion between the gate electrode layer 401 and the conductive layer 411, a region where both the layers are in contact with each other is preferably large. As illustrated in FIG. 1A, the length of the region where the gate electrode layer 401 and the conductive layer 411 are in contact with each other in the direction of the channel length of the oxide semiconductor layer 403 is preferably longer than the channel length of the oxide semiconductor layer 403.

The oxide semiconductor layer 403 is provided at the center, the gate insulating layer 402 and the insulating layer 407 seal the oxide semiconductor layer 403 by being in contact with each other at the opposite end portions, and further, the gate electrode layer 401 and the conductive layer 411 seal the above stack by being in contact with each other at the opposite end portions, whereby a structure that is symmetric with respect to line C1-C2 can be obtained. With the above structure, the force indicated by the arrow 445 can be evenly dispersed, whereby local application of great force to the oxide semiconductor layer 403 can be prevented.

Therefore, in the transistor 410, resistance to bending in the direction of the channel width of the oxide semiconductor layer 403 is improved, and thus the transistor 410 can be impact-resistant.

In a driver circuit, it is preferable that a transistor have a long channel width so that a larger amount of current can flow. However, when the transistor has a long channel width, influence by external force in the channel width direction is increased. Therefore, it is effective to apply a transistor which has resistance to bending in the channel width direction as described in this embodiment to the driver circuit in order to achieve a highly impact-resistant and highly reliable semiconductor device.

Since the transistor is impact-resistant, it can be applied to a flexible semiconductor device by using a flexible substrate for the substrate 400, and a more convenient and highly reliable semiconductor device which can be used for a variety of applications can be provided.

Since the transistor disclosed in this specification is particularly excellent in resistance to bending in the direction of the channel width of the oxide semiconductor layer, in manufacture of a semiconductor device, it is preferable to form the transistor such that the channel width direction thereof matches a direction in which the semiconductor device is likely to be bent (a direction in which the semiconductor device is frequently bent).

FIGS. 3A1 to 3E2 illustrate an example of a method for manufacturing the transistor 410. Note that FIGS. 3A1, 3B1, 3C1, 3D1, and 3E1 correspond to FIG. 1B, whereas FIGS. 3A2, 3B2, 3C2, 3D2, and 3E2 correspond to FIG. 1C.

First, a conductive film is formed over the substrate 400 having an insulating surface, and then, the gate electrode layer 401 is formed by a first photolithography step. Note that a resist mask may be formed by an inkjet method. Formation of the resist mask by an inkjet method needs no photomask; thus, manufacturing cost can be reduced.

For the substrate 400 having an insulating surface, a flexible substrate can be used. For example, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, or a polyvinylchloride resin is preferably used. A structure body in which a fibrous body is impregnated with an organic resin (so-called prepreg) may also be used as a flexible substrate. In addition, over the substrate 400, a protective film having low permeability may be formed in advance, and examples thereof include a film containing nitrogen and silicon such as a silicon nitride film or a silicon oxynitride film, a film containing nitrogen and aluminum such as an aluminum nitride film, and the like.

In the case where a fibrous body is contained in the material of the substrate 400, a high-strength fiber of an organic compound or an inorganic compound is used as the fibrous body. The high-strength fiber is specifically a fiber with a high tensile modulus of elasticity or a fiber with a high Young's modulus. As a typical example of the high-strength fiber, a polyvinyl alcohol based fiber, a polyester based fiber, a polyamide based fiber, a polyethylene based fiber, an aramid based fiber, a polyparaphenylene benzobisoxazole fiber, a glass fiber, or a carbon fiber can be given. As the glass fiber, there is a glass fiber using E glass, S glass, D glass, Q glass, or the like. These fibers may be used in a state of a woven fabric or a nonwoven fabric, and a structure body in which such a fibrous body is impregnated with an organic resin and the organic resin is cured may be used as the substrate 400. The structure body including the fibrous body and the organic resin is preferably used as the substrate 400 because reliability to bending or damaging due to local pressure can be increased.

Alternatively, a glass substrate (such as a substrate of barium borosilicate glass or aluminoborosilicate glass) which is thinned so as to have flexibility or a metal substrate which is processed into a film may be used. A material for forming the metal substrate is not limited to a particular material, but aluminum, copper, nickel, an alloy of metals such as an aluminum alloy or stainless steel, or the like is preferably used.

In order to manufacture a flexible semiconductor device, the transistor 410 including the oxide semiconductor layer 403 may be directly formed over a flexible substrate. Alternatively, the transistor 410 including the oxide semiconductor layer 403 may be formed over a manufacturing substrate, and then, the transistor 410 may be separated and transferred to a flexible substrate. Note that in order to separate the transistor from the manufacturing substrate and transfer it to the flexible substrate, a separation layer may be provided between the manufacturing substrate and the transistor including the oxide semiconductor layer.

An insulating film serving as a base film may be provided between the substrate 400 and the gate electrode layer 401. The base film has a function of preventing diffusion of impurity elements from the substrate 400, and can be formed with a single-layer structure or a stack structure using one or more of a silicon nitride film, a silicon oxide film, a silicon nitride oxide film, and a silicon oxynitride film.

The gate electrode layer 401 can be formed to have a single-layer structure or a stack structure using a metal material such as molybdenum, titanium, tantalum, tungsten, aluminum, copper, neodymium, or scandium, or an alloy material which contains any of these materials as a main component.

Next, the gate insulating layer 402 is formed over the gate electrode layer 401. The gate insulating layer 402 can be formed with a single-layer structure or a stack structure using one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like.

The oxide semiconductor in this embodiment is an intrinsic (i-type) or substantially intrinsic (i-type) oxide semiconductor from which an impurity is removed and which is highly purified so as to contain an impurity that serves as a carrier donor and is a substance other than the main component of the oxide semiconductor as little as possible.

The highly purified oxide semiconductor layer contains extremely few carriers (close to zero), and the carrier concentration thereof is lower than $1\times10^{14}/cm^3$, preferably lower than $1\times10^{12}/cm^3$, more preferably lower than $1\times10^{11}/cm^3$.

Since there are extremely few carriers in the oxide semiconductor layer, the off-state current of the transistor can be small. It is preferable that the off-state current be as small as possible.

Such a highly purified oxide semiconductor is highly sensitive to an interface state and interface electric charge; thus, an interface between the oxide semiconductor layer and the gate insulating layer is important. For that reason, the gate insulating layer that is to be in contact with the highly purified oxide semiconductor needs to have high quality.

For example, high-density plasma CVD using microwaves (e.g., with a frequency of 2.45 GHz) is preferably adopted because an insulating layer formed can be dense and have high withstand voltage and high quality. When the highly purified oxide semiconductor and the high-quality gate insulating layer are in close contact with each other, the interface state density can be reduced to obtain favorable interface characteristics.

Needless to say, another film formation method such as a sputtering method or a plasma CVD method can be employed as long as the method enables formation of a good-quality insulating layer as the gate insulating layer. Moreover, an insulating layer whose film quality as the gate insulating layer and whose characteristics of an interface with the oxide semiconductor are improved by heat treatment performed after the formation may be used. In any case, any insulating layer that has a reduced interface state density and can form a favorable interface with the oxide semiconductor, as well as having good film quality as a gate insulating layer, may be used.

Further, in order that hydrogen, hydroxyl group, and moisture might be contained in the gate insulating layer 402 and an oxide semiconductor film 440 as little as possible, it is preferable that, as pretreatment before formation of the oxide semiconductor film 440, the substrate 400 over which layers up to and including the gate electrode layer 401 are formed or the substrate 400 over which layers up to and including the gate insulating layer 402 are formed be preheated in a preheating chamber of a sputtering apparatus so that impurities such as hydrogen and moisture adsorbed to the substrate 400 are eliminated and removed. As an evacuation unit provided in the preheating chamber, a cryopump is preferable. Note that this preheating treatment can be omitted. Further, this preheating may also be performed on the substrate 400 over which layers up to and including the source electrode layer 405a and the drain electrode layer 405b are formed, before the formation of the insulating layer 407.

Next, over the gate insulating layer 402, the oxide semiconductor film 440 with a thickness of greater than or equal to 2 nm and less than or equal to 200 nm, preferably greater than or equal to 5 nm and less than or equal to 30 nm is formed (see FIGS. 3A1 and 3A2).

Note that before the oxide semiconductor film 440 is formed by a sputtering method, powder substances (also referred to as particles or dusts) which are attached on a surface of the gate insulating layer 402 are preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate and modify a surface. Note that instead of an argon atmosphere, a nitrogen atmosphere, a helium atmosphere, an oxygen atmosphere, or the like may be used.

As an oxide semiconductor used for the oxide semiconductor film 440, any of the following oxide semiconductors can be used: a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor, or an In—O-based oxide semiconductor, a Sn—O-based oxide semiconductor, or a Zn—O-based oxide semiconductor, and the like. $SiO_2$ may be contained in the above oxide semiconductor. Note that in this specification, for example, an In—Ga—Zn—O-based oxide semiconductor film means an oxide film containing indium (In), gallium (Ga), and zinc (Zn), and there is no particular limitation on the stoichiometric proportion. The In—Ga—Zn—O-based oxide semiconductor film may contain an element other than In, Ga, and Zn.

In addition, for the oxide semiconductor film 440, a thin film of a material represented by the chemical formula, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

In this embodiment, the oxide semiconductor film 440 is formed by a sputtering method with the use of an In—Ga—Zn—O-based oxide semiconductor target. In addition, the oxide semiconductor film 440 can be formed by a sputtering method in a rare gas (typically argon) atmosphere, an oxygen atmosphere, or a mixed atmosphere containing a rare gas and oxygen.

As a target for forming the oxide semiconductor film 440 by a sputtering method, for example, an oxide target containing $In_2O_3$, $Ga_2O_3$, and ZnO at a composition ratio (molar ratio) of 1:1:1 is used, and with the use of the target, an In—Ga—Zn—O film is formed. Without limitation to the material and the composition of the target described above, for example, an oxide target containing $In_2O_3$, $Ga_2O_3$, and ZnO at 1:1:2 [molar ratio] may be used.

The filling rate of the oxide target is higher than or equal to 90% and lower than or equal to 100%, preferably higher than or equal to 95% and lower than or equal to 99.9%. With the use of the metal oxide target with a high filling rate, a dense oxide semiconductor film can be formed.

It is preferable that a high-purity gas from which impurities such as hydrogen, water, hydroxyl group, or hydride are removed be used as a sputtering gas for forming the oxide semiconductor film 440.

The substrate is held in a deposition chamber kept under reduced pressure, and the substrate temperature is set to higher than or equal to 100° C. and lower than or equal to 600° C., preferably higher than or equal to 200° C. and lower than or equal to 400° C. By forming the oxide semiconductor film in a state where the substrate is heated, the concentration of impurities in the formed oxide semiconductor film can be reduced. In addition, damage by sputtering can be reduced. Then, residual moisture in the deposition chamber is removed, a sputtering gas from which hydrogen and moisture are removed is introduced, and the above-described target is used, so that the oxide semiconductor film 440 is formed over the substrate 400. In order to remove the residual moisture from the deposition chamber, an entrapment vacuum pump, for example, a cryopump, an ion pump, or a titanium sublimation pump is preferably used. Further, an evacuation unit may be a turbo pump (turbo molecular pump) provided with a cold trap. From the deposition chamber which is evacuated with the cryopump, for example, a hydrogen atom, a compound containing a hydrogen atom such as water ($H_2O$) (more preferably, also a compound containing a carbon atom), and the like are removed, whereby the concentration of impurities in the oxide semiconductor film that is formed in the deposition chamber can be reduced.

As one example of the deposition condition, the distance between the substrate and the target is 100 mm, the pressure is 0.6 Pa, the electric power of a direct-current (DC) power source is 0.5 kW, and the atmosphere is an oxygen atmosphere (the proportion of the oxygen flow rate is 100%). Note that a pulse direct current power source is preferable because powder substances (also referred to as particles or dusts) generated in the film formation can be reduced and the film thickness can be uniform.

Next, the oxide semiconductor film 440 is processed into an island-shaped oxide semiconductor layer by a second photolithography step. A resist mask for forming the island-shaped oxide semiconductor layer may be formed by an inkjet method. Formation of the resist mask by an inkjet method needs no photomask; thus, manufacturing cost can be reduced.

In the case where a contact hole is formed in the gate insulating layer 402, a step of forming the contact hole can be performed at the same time as processing of the oxide semiconductor film 440.

Note that the etching of the oxide semiconductor film 440 here may be performed by dry etching, wet etching, or both dry etching and wet etching. For example, as an etchant used for wet etching of the oxide semiconductor film 440, a solution obtained by mixing phosphoric acid, acetic acid, and nitric acid, ammonia hydrogen peroxide (hydrogen peroxide at 31 wt %:ammonia water at 28 wt %:water=5:2:2), or the like can be used. In addition, ITO07N (produced by KANTO CHEMICAL CO., INC.) may be used.

Next, the oxide semiconductor layer is subjected to first heat treatment. The oxide semiconductor layer can be dehydrated or dehydrogenated by this first heat treatment. The temperature of the first heat treatment is set to higher than or equal to 400° C. and lower than or equal to 750° C., or higher than or equal to 400° C. and lower than the strain point of the substrate. In this embodiment, the substrate is put in an electric furnace which is a kind of heat treatment apparatus and heat treatment is performed on the oxide semiconductor layer in a nitrogen atmosphere at 450° C. for one hour, and then water and hydrogen are prevented from entering the oxide semiconductor layer with the oxide semiconductor layer not exposed to the air. In this manner, an oxide semiconductor layer 441 is obtained (see FIGS. 3B1 and 3B2).

The heat treatment apparatus is not limited to an electric furnace, and a device for heating an object to be processed by heat conduction or heat radiation from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. For the high-temperature gas, an inert gas which does not react with an object to be processed by heat treatment, such as nitrogen or a rare gas such as argon, is used.

For example, as the first heat treatment, GRTA by which the substrate is transferred and put in an inert gas heated to a high temperature of 650° C. to 700° C., heated for several minutes, and transferred and taken out of the inert gas heated to the high temperature may be performed.

Note that in the first heat treatment, it is preferable that water, hydrogen, and the like be not contained in nitrogen or a rare gas such as helium, neon, or argon. Alternatively, nitrogen or a rare gas such as helium, neon, or argon which is introduced into the heat treatment apparatus has a purity of higher than or equal to 6N (99.9999%), preferably higher than or equal to 7N (99.99999%) (that is, the impurity concentration is lower than or equal to 1 ppm, preferably lower than or equal to 0.1 ppm).

Further, after the oxide semiconductor layer is heated in the first heat treatment, a high-purity oxygen gas, a high-purity $N_2O$ gas, or an ultra-dry air (the dew point is lower than or equal to −40° C., preferably lower than or equal to −60° C.) may be introduced into the same furnace. It is preferable that the oxygen gas or the $N_2O$ gas does not contain water, hydrogen, and the like. Alternatively, the oxygen gas or the $N_2O$ gas which is introduced into the heat treatment apparatus has a purity of higher than or equal to 6N, preferably higher than or equal to 7N (that is, the impurity concentration in the oxygen gas or the $N_2O$ gas is lower than or equal to 1 ppm, preferably lower than or equal to 0.1 ppm). By the action of the oxygen gas or the $N_2O$ gas, oxygen which is a main component of the oxide semiconductor and which has been reduced at the same time as the step for removing impurities by dehydration or dehydrogenation is supplied, so that the oxide semiconductor layer can be a highly purified and electrically i-type (intrinsic) oxide semiconductor layer.

The first heat treatment of the oxide semiconductor layer can be performed on the oxide semiconductor film 440 before being processed into the island-shaped oxide semiconductor layer. In that case, the substrate is taken out of the heat treatment apparatus after the first heat treatment, and then a photolithography step is performed.

Note that the first heat treatment may be performed at any of the following timings besides the above as long as it is after the oxide semiconductor layer is formed; after the source electrode layer and the drain electrode layer are formed over the oxide semiconductor layer; and after the insulating layer is formed over the source electrode layer and the drain electrode layer.

Further, the step of forming the contact hole in the gate insulating layer 402 may be performed either before or after the first heat treatment is performed on the oxide semiconductor film 440.

In addition, as the oxide semiconductor layer, an oxide semiconductor layer having a crystal region (a single crystal region) with a large thickness, that is, a crystal region which is c-axis-aligned perpendicularly to a surface may be formed by performing deposition twice and heat treatment twice, regardless of a material of a base component such as an oxide, a nitride, or a metal. For example, a first oxide semiconductor film with a thickness of greater than or equal to 3 nm and less than or equal to 15 nm is deposited, and first heat treatment is performed in a nitrogen, oxygen, rare gas, or dry air atmosphere at higher than or equal to 450° C. and lower than or equal to 850° C., preferably higher than or equal to 550° C. and lower than or equal to 750° C., so that the first oxide semiconductor film having a crystal region (including a plate-like crystal) in a region including a surface is formed. Then, a second oxide semiconductor film which has a larger thickness than the first oxide semiconductor film is formed, and second heat treatment is performed at higher than or equal to 450° C. and lower than or equal to 850° C., preferably higher than or equal to 600° C. and lower than or equal to 700° C., so that crystal growth proceeds upward with the use of the first oxide semiconductor film as a seed of the crystal growth and the whole second oxide semiconductor film is crystallized. In such a manner, the oxide semiconductor layer having a crystal region with a large thickness may be formed.

Next, a conductive film to be a source electrode layer and a drain electrode layer (including a wiring formed in the same layer as the source electrode layer and the drain electrode layer) is formed over the gate insulating layer 402 and the oxide semiconductor layer 441. As the conductive film used for the source electrode layer and the drain electrode layer, for example, a metal film containing an element selected from Al, Cr, Cu, Ta, Ti, Mo, and W, a metal nitride film containing any of the above elements as its component (a titanium nitride film, a molybdenum nitride film, or a tungsten nitride film), or the like can be used. Alternatively, a film of a high melting point metal such as Ti, Mo, or W or a metal nitride film of any of these elements (a titanium nitride film, a molybdenum nitride film, or a tungsten nitride film) may be stacked on one or both of a lower side or an upper side of a film of a metal such as Al or Cu. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO in some cases), indium oxide-zinc oxide alloy ($In_2O_3$—ZnO), or any of these metal oxide materials in which silicon oxide is contained can be used.

A resist mask is formed over the conductive film by a third photolithography step. Etching is selectively performed, so that the source electrode layer 405a and the drain electrode layer 405b are formed. Then, the resist mask is removed.

Light exposure at the time of the formation of the resist mask by the third photolithography step may be performed using ultraviolet light, KrF laser light, or ArF laser light. A channel length L of the transistor that is completed later is determined by a distance between bottom ends of the source electrode layer and the drain electrode layer, which are adjacent to each other over the oxide semiconductor layer 441. In the case where light exposure is performed for a channel length L of shorter than 25 nm, the light exposure at the time of the formation of the resist mask in the third photolithography step may be performed using extreme ultraviolet light having an extremely short wavelength of several nanometers to several tens of nanometers. In the light exposure using extreme ultraviolet light, the resolution is high and the focus depth is large. For these reasons, the channel length L of the transistor that is completed later can also be longer than or equal to 10 nm and shorter than or equal to 1000 nm, and the circuit can operate at higher speed.

In order to reduce the number of photomasks and the number of steps in photolithography, an etching step may be performed using a resist mask formed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by using one multi-tone mask. Thus, the number of light-exposure masks can be reduced and the number of corresponding steps in photolithography can be also reduced, whereby simplification of a process can be realized.

Note that it is preferable that etching conditions be optimized so as not to etch and divide the oxide semiconductor layer 441 when the conductive film is etched. However, it is difficult to obtain etching conditions in which only the conductive film is etched and the oxide semiconductor layer 441 is not etched at all. In some cases, only part of the oxide semiconductor layer 441 is etched to be an oxide semiconductor layer having a groove portion (a recessed portion) when the conductive film is etched.

In this embodiment, since a Ti film is used as the conductive film and an In—Ga—Zn—O-based oxide semiconductor is used as the oxide semiconductor layer 441, ammonium hydrogen peroxide (a mixture of ammonia, water, and hydrogen peroxide) is used as an etchant.

Next, by plasma treatment using a gas such as $N_2O$, $N_2$, or Ar, water or the like adsorbed to a surface of an exposed portion of the oxide semiconductor layer may be removed. In the case where the plasma treatment is performed, the insulating layer 407 which in contact with part of the oxide semiconductor layer is formed without exposure to the air.

The insulating layer 407 can be formed to a thickness of at least 1 nm using a method by which impurities such as water or hydrogen do not enter the insulating layer 407, such as a sputtering method as appropriate. When hydrogen is contained in the insulating layer 407, entry of the hydrogen into the oxide semiconductor layer or extraction of oxygen from the oxide semiconductor layer due to the hydrogen is caused, thereby making the resistance of a backchannel of the oxide semiconductor layer low (making the backchannel have n-type conductivity), so that a parasitic channel might be formed. Therefore, it is important that a film formation method in which hydrogen is not used is employed in order to form the insulating layer 407 containing as little hydrogen as possible.

As the insulating layer 407, an inorganic insulating film such as a silicon oxide film, a silicon oxynitride film, an aluminum oxide film, or an aluminum oxynitride film can be typically used.

In this embodiment, a 200-nm-thick silicon oxide film is formed as the insulating layer 407 by a sputtering method. The substrate temperature in film formation may be higher than or equal to room temperature and lower than or equal to 300° C. and is 100° C. in this embodiment. The silicon oxide film can be formed by a sputtering method in a rare gas (typically argon) atmosphere, an oxygen atmosphere, or a mixed atmosphere containing a rare gas and oxygen. As a target, a silicon oxide target or a silicon target can be used. For example, the silicon oxide film can be formed using a silicon target by a sputtering method in an atmosphere containing oxygen. As the insulating layer 407 which is formed in contact with the oxide semiconductor layer, an inorganic insulating film which does not contain impurities such as moisture, a hydrogen ion, and OH⁻ and blocks entry of these from the outside is used. Typically, a silicon oxide film, a silicon oxynitride film, an aluminum oxide film, an aluminum oxynitride film, or the like is used.

In order to remove residual moisture from the deposition chamber of the insulating layer 407 in a manner similar to that of the deposition of the oxide semiconductor film 440, an entrapment vacuum pump (such as a cryopump) is preferably used. When the insulating layer 407 is deposited in the deposition chamber evacuated using a cryopump, the impurity concentration of the insulating layer 407 can be reduced. In addition, as an evacuation unit for removing the residual moisture from the deposition chamber of the insulating layer 407, a turbo pump (a turbo molecular pump) provided with a cold trap may be used.

It is preferable that a high-purity gas from which impurities such as hydrogen, water, hydroxyl group, or hydride are removed be used as a sputtering gas when the insulating layer 407 is formed.

Next, second heat treatment is performed in an inert gas atmosphere or an oxygen gas atmosphere (preferably at higher than or equal to 200° C. and lower than or equal to 400° C., e.g., higher than or equal to 250° C. and lower than or equal to 350° C.). For example, the second heat treatment is performed in a nitrogen atmosphere at 250° C. for one hour. In the second heat treatment, part of the oxide semiconductor layer (a channel formation region) is heated while being in contact with the insulating layer 407.

Through the above process, the first heat treatment is performed on the oxide semiconductor film, so that impurities such as hydrogen, moisture, hydroxyl group, or hydride (also referred to as a hydrogen compound) are intentionally removed from the oxide semiconductor layer. Additionally, oxygen which is one of main components of the oxide semiconductor and is simultaneously reduced in a step of removing an impurity can be supplied. Therefore, the oxide semiconductor layer is highly purified and is made to be an electrically i-type (intrinsic) oxide semiconductor layer.

Through the above-described steps, the transistor 410 is formed (see FIGS. 3C1 and 3C2).

When a silicon oxide layer having a lot of defects is used as the insulating layer 407, with the heat treatment which is performed after the formation of the silicon oxide layer, impurities such as hydrogen, moisture, hydroxyl group, or hydride contained in the oxide semiconductor layer can be diffused into the silicon oxide layer so that impurities in the oxide semiconductor layer can be further reduced.

A protective insulating layer may be formed over the insulating layer 407. For example, a silicon nitride film is formed by an RF sputtering method. An RF sputtering method has superiority in mass production and thus is a preferable method for forming the protective insulating layer. As the protective insulating layer, an inorganic insulating film which does not contain an impurity such as moisture and blocks entry of these from the outside, such as a silicon nitride film or an aluminum nitride film, is used.

After the formation of the protective insulating layer, heat treatment may be further performed in the air at higher than or equal to 100° C. and lower than or equal to 200° C. for longer than or equal to 1 hour and shorter than or equal to 30 hours. This heat treatment may be performed at a fixed heating temperature. Alternatively, the following change in the heating temperature may be conducted plural times repeatedly: the heating temperature is increased from a room temperature to a temperature of higher than or equal to 100° C. and lower than or equal to 200° C. and then decreased to a room temperature.

Next, the gate insulating layer 402 and the insulating layer 407 are selectively removed, so that an opening 412a and an opening 412b where the gate electrode layer 401 is exposed are formed (see FIGS. 3D1 and 3D2). As illustrated in FIG. 3D2, the opening 412a and the opening 412b are formed in the gate insulating layer 402 and the insulating layer 407 such that the gate insulating layer 402 and the insulating layer 407 surround and seal the oxide semiconductor layer 403 which is provided at the center in the direction of the channel width of the oxide semiconductor layer 403. In this embodiment, the gate insulating layer 402 and the insulating layer 407 are etched with the use of the same mask and thus their end portions are substantially aligned with each other.

Then, a conductive film is formed over the insulating layer 407 and etched by a photolithography step, whereby the conductive layer 411 is formed (FIGS. 3E1 and 3E2). The conductive layer 411 is formed so as to cover at least the channel formation region of the oxide semiconductor layer 403.

As illustrated in FIG. 3E2, the conductive layer 411 is formed so as to cover top portions and opposite end portions of the gate insulating layer 402 and the insulating layer 407 which surround the oxide semiconductor layer 403 provided over the gate electrode layer 401 and be in contact with the gate electrode layer 401 exposed at the openings. The conductive layer 411 is in contact with the gate electrode layer 401 and thus has the same potential as the gate electrode layer 401.

By providing the conductive layer 411 having the same potential as the gate electrode layer 401, a parasitic channel due to leakage current can be prevented from being formed in the backchannel of the transistor 410.

In addition, the conductive layer 411 functions to block an external electric field (particularly, to block static electricity), that is, to prevent an external electric field from acting on the inside (a circuit portion including the transistor). Such a blocking function of the conductive layer 411 can prevent variation in electric characteristics of the transistor 410 due to the influence of an external electric field such as static electricity.

In the transistor 410 including the highly purified oxide semiconductor layer 403 which is formed in accordance with this embodiment, the value of a current in an off state (the value of the off-state current) can be reduced to a value of lower than 10 zA/μm for a channel width of 1 μm (a value of lower than 100 zA/μm at 85° C.).

In addition, the transistor 410 which includes the oxide semiconductor layer 403 can operate at high speed because it can achieve field-effect mobility that is relatively high. Therefore, by using the transistor in a pixel portion of a liquid crystal display device, a high-quality image can be provided. In addition, by using the transistor including the highly purified oxide semiconductor layer, since a driver circuit portion and a pixel portion can be formed over one substrate, the number of components of the semiconductor device can be reduced.

As described above, a channel formation region of an oxide semiconductor layer is surrounded by a gate insulating layer and an insulating layer which are stacked and also by a gate electrode layer and a conductive layer in a channel width direction; thus, a semiconductor device can be impact-resistant.

In addition, by being formed to be flexible, a semiconductor device can be used for a variety of applications, and a more convenient and highly reliable semiconductor device can be provided.

Embodiment 2

In this embodiment, another embodiment of a semiconductor device will be described with reference to FIGS. 2A and 2B. In this embodiment, a transistor will be described as an example of the semiconductor device. The same portions as those in Embodiment 1 and portions having functions similar to those in Embodiment 1 and the same steps as those in Embodiment 1 and steps similar to those in Embodiment 1 may be handled as in Embodiment 1, and repeated description is omitted. In addition, detailed description of the same portions is not repeated.

Figure 2A:
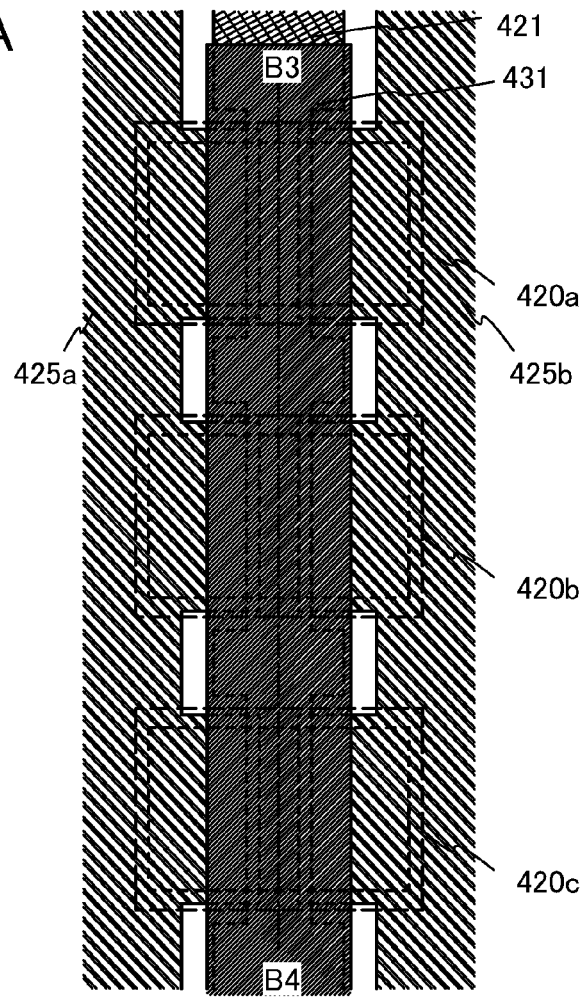
FIGS. 2A and 2B illustrate an embodiment of a semiconductor device.
Figure 2B:
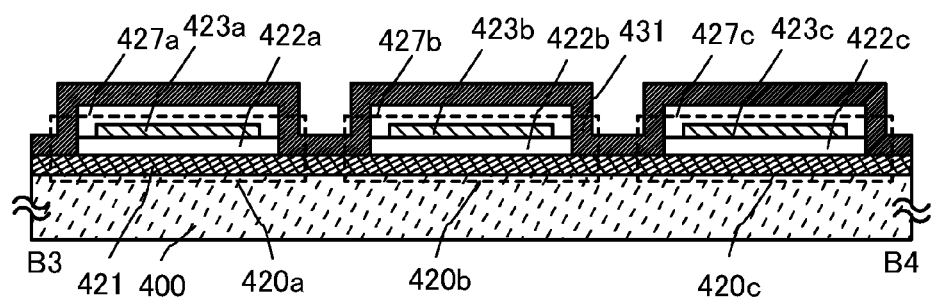

FIGS. 2A and 2B illustrate transistors 420a, 420b, and 420c which are connected in parallel. By parallel connection of a plurality of the transistors 420a, 420b, and 420c, substantially the same effect as in the case of a wide channel width can be obtained, and a larger amount of current can flow. When such a structure in which a plurality of transistors are provided in parallel so as to share the channel width or the like is used in combination, the circuit can be designed more freely. The structure including the transistors 420a, 420b, and 420c in which a larger amount of current can flow is preferably used for transistors for a driver circuit in a driver circuit portion.

A channel formation region of each of oxide semiconductor layers 423a, 423b, and 423c of the transistors 420a, 420b, and 420c, respectively, has a channel length (L) direction and a channel width (W) direction.

FIG. 2A is a plan view of the transistors 420a, 420b, and 420c, and FIG. 2B is a cross-sectional view along line B3-B4 in the channel width (W) direction of the transistors 420a, 420b, and 420c illustrated in FIG. 2A.

As illustrated in FIGS. 2A and 2B, the transistors 420a, 420b, and 420c include, over a substrate 400 having an insulating surface, a gate electrode layer 421, a gate insulating layer 422 (gate insulating layers 422a, 422b, and 422c), the oxide semiconductor layers 423a, 423b, and 423c, a source electrode layer 425a, and a drain electrode layer 425b. An insulating layer 427 (insulating layers 427a, 427b, and 427c) and a conductive layer 431 are stacked in this order over the transistors 420a, 420b, and 420c.

The transistors 420a, 420b, and 420c are connected in parallel and have the gate electrode layer 421, the source electrode layer 425a, and the drain electrode layer 425b in common.

In the cross-sectional view in the channel width direction in FIG. 2B, the gate insulating layers 422a, 422b, and 422c and the insulating layers 427a, 427b, and 427c cover top portions, bottom portions, and end portions of the oxide semiconductor layers 423a, 423b, and 423c so as to surround the oxide semiconductor layers 423a, 423b, and 423c respectively and are in contact with each other at opposite end portions of the oxide semiconductor layers 423a, 423b, and 423c respectively. The gate electrode layer 421 is provided below the gate insulating layers 422a, 422b, and 422c, and the conductive layer 431 is provided over the insulating layers 427a, 427b, and 427c so as to cover top portions of the oxide semiconductor layers 423a, 423b, and 423c, the gate insulating layers 422a, 422b, and 422c, and the insulating layers 427a, 427b, and 427c and opposite end portions of the gate insulating layers 422a, 422b, and 422c and the insulating layers 427a, 427b, and 427c. Moreover, the conductive layer 431 is in contact with the gate electrode layer 421.

In the above manner, the oxide semiconductor layers 423a, 423b, and 423c are surrounded by the gate insulating layers 422a, 422b, and 422c and the insulating layers 427a, 427b, 427c respectively, and also by the gate electrode layer 421 and the conductive layer 431 in the channel width direction.

With the structure as described above in which the peripheries of the oxide semiconductor layers 423a, 423b, and 423c are protected by a stack including the gate electrode layer, the gate insulating layers, the insulating layers, and the conductive layer, even when force is applied in the channel width direction, the thick stack structure is unlikely to be bent, so that force applied to the oxide semiconductor layers 423a, 423b, and 423c which are at the center of the stack can be reduced. Accordingly, the oxide semiconductor layers 423a, 423b, and 423c can be prevented from being broken owing to external impact.

In addition, an opening where the gate electrode layer 421 is exposed widely is formed in the gate insulating layer 422 (the gate insulating layers 422a, 422b, and 422c) and the insulating layer 427 (the insulating layers 427a, 427b, and 427c), and the gate electrode layer 421 and the conductive layer 431 are in contact with each other at the opening. By using a conductive film with high adhesion for each of the gate electrode layer 421 and the conductive layer 431, the gate electrode layer 421, the gate insulating layers 422a, 422b, and 422c, the oxide semiconductor layers 423a, 423b, and 423c, the insulating layers 427a, 427b, and 427c, and the conductive layer 431 can be prevented from peeling at the interface thereof owing to external force.

In order to increase adhesion between the gate electrode layer 421 and the conductive layer 431, a region where both the layers are in contact with each other is preferably large. As illustrated in FIG. 2A, the length of the region where the gate electrode layer 421 and the conductive layer 431 are in contact with each other in the direction of the channel length of the oxide semiconductor layers 423a, 423b, and 423c is preferably longer than the channel length of the oxide semiconductor layers 423a, 423b, and 423c.

In the transistors 420a, 420b, and 420c, the oxide semiconductor layers 423a, 423b, and 423c are provided at the center, the gate insulating layers 422a, 422b, and 422c and the insulating layers 427a, 427b, and 427c seal the oxide semiconductor layers 423a, 423b, and 423c by being in contact with each other at the opposite end portions, and further the gate electrode layer 421 and the conductive layer 431 seal the above stacks by being in contact with each other at the opposite end portions, whereby structures that are symmetric can be obtained. With the above structure, the external force can be evenly dispersed, whereby local application of great force to the oxide semiconductor layers 423a, 423b, and 423c can be prevented.

Therefore, in the transistors 420a, 420b, and 420c, resistance to bending in the direction of the channel width of the oxide semiconductor layers 423*a*, 423*b*, and 423*c* is improved, and thus the transistors 420*a*, 420*b*, and 420*c* can be impact-resistant.

Since the transistors are impact-resistant, they can be applied to a flexible semiconductor device by using a flexible substrate for the substrate 400, and a more convenient and highly reliable semiconductor device which can be used for a variety of applications can be provided.

As described above, channel formation regions of oxide semiconductor layers are surrounded by gate insulating layers and insulating layers which are stacked and also by a gate electrode layer and a conductive layer in the channel width direction; thus, a semiconductor device can be impact-resistant.

In addition, by being formed to be flexible, a semiconductor device can be used for a variety of applications, and a more convenient and highly reliable semiconductor device can be provided.

This embodiment can be implemented by being combined with any of other embodiments as appropriate.

Embodiment 3

In this embodiment, another embodiment of a semiconductor device will be described with reference to FIGS. 5A to 5C. In this embodiment, a transistor will be described as an example of the semiconductor device. An example in which a formation step and a structure of a source electrode layer and a drain electrode layer are different from those of the transistor described in Embodiment 1 will be described. Therefore, the same portions as those in Embodiment 1 and portions having functions similar to those in Embodiment 1 and the same steps as those in Embodiment 1 and steps similar to those in Embodiment 1 may be handled as in Embodiment 1, and repeated description is omitted. In addition, detailed description of the same portions is not repeated.

In Embodiments 1 and 2, the source electrode layer 405*a* and the drain electrode layer 405*b* are provided between the oxide semiconductor layer 403 and the insulating layer 407. In this embodiment, the source electrode layer 405*a* and the drain electrode layer 405*b* are provided between the gate insulating layer 402 and the oxide semiconductor layer 403.

Figure 5A:
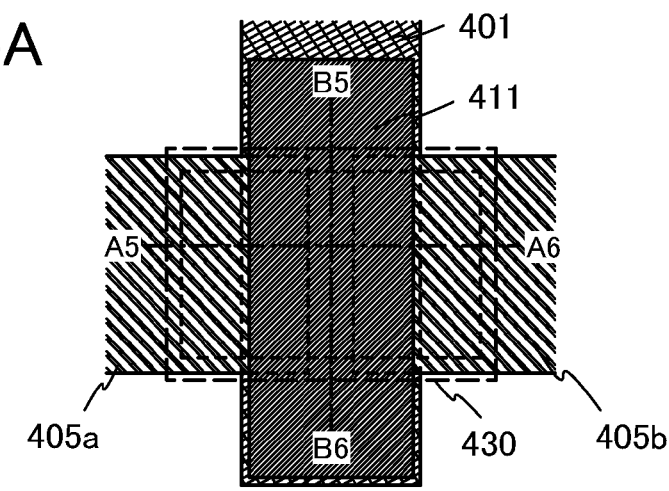
FIGS. 5A to 5C illustrate an embodiment of a semiconductor device.
Figure 5B:
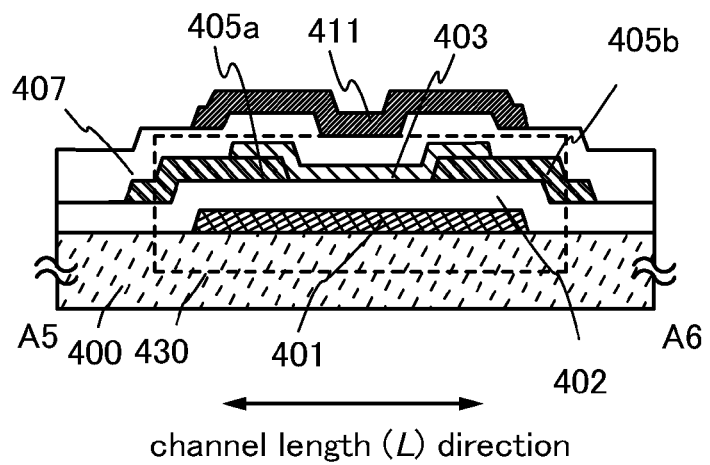
Figure 5C:
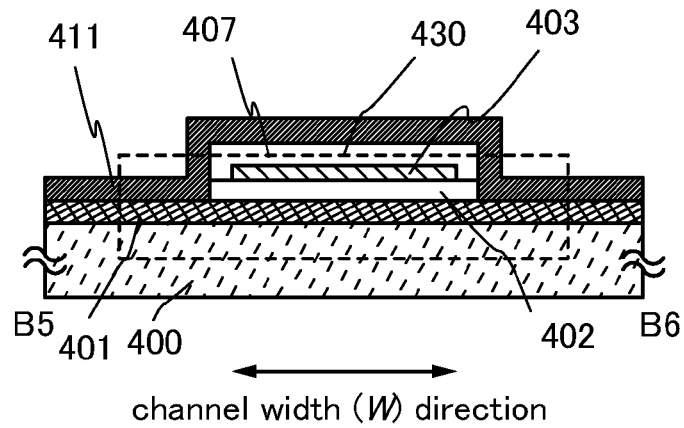

FIG. 5A is a plan view of a transistor 430, FIG. 5B is a cross-sectional view along line A5-A6 in the channel length (L) direction of the transistor 430 illustrated in FIG. 5A, and FIG. 5C is a cross-sectional view along line B5-B6 in the channel width (W) direction.

The transistor 430 illustrated in FIGS. 5A to 5C is a bottom-gate transistor and includes, over a substrate 400, a gate electrode layer 401, a gate insulating layer 402, a source electrode layer 405*a*, a drain electrode layer 405*b*, and an oxide semiconductor layer 403. In addition, an insulating layer 407 which covers the transistor 430 and is in contact with the oxide semiconductor layer 403 is provided.

In the transistor 430, the gate insulating layer 402 is provided on and in contact with the substrate 400 and the gate electrode layer 401, and the source electrode layer 405*a* and the drain electrode layer 405*b* are provided on and in contact with the gate insulating layer 402. Further, the oxide semiconductor layer 403 is provided over the gate insulating layer 402, the source electrode layer 405*a*, and the drain electrode layer 405*b*.

In the cross-sectional view in the channel width direction in FIG. 5C, the gate insulating layer 402 and the insulating layer 407 cover a top portion, a bottom portion, and end portions of the oxide semiconductor layer 403 so as to surround the oxide semiconductor layer 403 and are in contact with each other at opposite end portions of the oxide semiconductor layer 403. The gate electrode layer 401 is provided below the gate insulating layer 402, and the conductive layer 411 is provided over the insulating layer 407, so as to cover top portions of the oxide semiconductor layer 403, the gate insulating layer 402, and the insulating layer 407 and opposite end portions of the gate insulating layer 402 and the insulating layer 407. Moreover, the conductive layer 411 is in contact with the gate electrode layer 401.

In the above manner, the oxide semiconductor layer 403 is surrounded by the gate insulating layer 402 and the insulating layer 407, and also by the gate electrode layer 401 and the conductive layer 411 in the channel width direction.

With the structure as described above in which the periphery of the oxide semiconductor layer 403 is protected by a stack including the gate electrode layer, the gate insulating layer, the insulating layer, and the conductive layer, even when force (external force) is applied in the channel width (W) direction, the thick stack structure is unlikely to be bent, so that force applied to the oxide semiconductor layer 403 which is at the center of the stack can be reduced. Accordingly, the oxide semiconductor layer 403 can be prevented from being broken owing to external impact.

In addition, an opening where the gate electrode layer 401 is exposed widely is formed in the gate insulating layer 402 and the insulating layer 407, and the gate electrode layer 401 and the conductive layer 411 are in contact with each other at the opening. By using a conductive film with high adhesion for each of the gate electrode layer 401 and the conductive layer 411, the gate electrode layer 401, the gate insulating layer 402, the oxide semiconductor layer 403, the insulating layer 407, and the conductive layer 411 can be prevented from peeling at the interface thereof owing to the external force.

In order to increase adhesion between the gate electrode layer 401 and the conductive layer 411, a region where both the layers are in contact with each other is preferably large. As illustrated in FIG. 5A, the length of the region where the gate electrode layer 401 and the conductive layer 411 are in contact with each other in the direction of the channel length of the oxide semiconductor layer 403 is preferably longer than the channel length of the oxide semiconductor layer 403.

The oxide semiconductor layer 403 is provided at the center, the gate insulating layer 402 and the insulating layer 407 seal the oxide semiconductor layer 403 by being in contact with each other at the opposite end portions, and further the gate electrode layer 401 and the conductive layer 411 seal the above stack by being in contact with each other at the opposite end portions, whereby a structure that is symmetric can be obtained. With the above structure, the external force can be evenly dispersed, whereby local application of great force to the oxide semiconductor layer 403 can be prevented.

Therefore, in the transistor 430, resistance to bending in the direction of the channel width of the oxide semiconductor layer 403 is improved, and thus the transistor 430 can be impact-resistant.

Since the transistor is impact-resistant, it can be applied to a flexible semiconductor device by using a flexible substrate for the substrate 400, and a more convenient and highly reliable semiconductor device which can be used for a variety of applications can be provided.

This embodiment can be implemented by being combined with any of other embodiments as appropriate.

Embodiment 4

In this embodiment, an example of a method for manufacturing a semiconductor device by separating a transistor from a manufacturing substrate and transferring the transistor to a flexible substrate will be described. A semiconductor device according an embodiment of the present invention will be described with reference to FIGS. 4A to 4D. Note that this embodiment is the same as Embodiment 1 except part of the process; thus, the same portions are denoted by the same reference numerals, and detailed description of the same portions is omitted.

An example of a method for manufacturing a semiconductor device will be described in detail with reference to FIGS. 4A to 4D.

A separation layer 302 is formed over a first manufacturing substrate 300 and a first insulating layer 301 is formed over the separation layer 302. Preferably, the first insulating layer 301 is successively formed without exposing the separation layer 302 that is formed to the air. This successive formation prevents dusts or impurities from entering an interface between the separation layer 302 and the first insulating layer 301.

As the first manufacturing substrate 300, a glass substrate, a quartz substrate, a sapphire substrate, a ceramic substrate, a metal substrate, or the like can be used. As the glass substrate, barium borosilicate glass, aluminoborosilicate glass, or the like can be used. Alternatively, a plastic substrate having heat resistance to the processing temperature of this embodiment may be used. In the manufacturing process of the semiconductor device, a manufacturing substrate can be selected as appropriate in accordance with the process.

Note that in this process, the separation layer 302 is formed over an entire surface of the first manufacturing substrate 300; however, after forming the separation layer 302 over the entire surface of the first manufacturing substrate 300, the separation layer 302 may be selectively removed so that the separation layer can be formed only over a desired region, if needed. Further, although the separation layer 302 is formed in contact with the first manufacturing substrate 300 in FIGS. 4A and 4B, an insulating layer such as a silicon oxide layer, a silicon oxynitride layer, a silicon nitride layer, or a silicon nitride oxide layer may be formed between the first manufacturing substrate 300 and the separation layer 302, if needed.

The separation layer 302 has a single-layer structure or a stack structure using an element selected from tungsten (W), molybdenum (Mo), titanium (Ti), tantalum (Ta), niobium (Nb), nickel (Ni), cobalt (Co), zirconium (Zr), ruthenium (Ru), rhodium (Rh), palladium (Pd), osmium (Os), iridium (Ir), and silicon (Si); an alloy material containing any of the elements as a main component; or a compound material containing any of the elements as a main component. A crystal structure of a layer containing silicon may be amorphous, microcrystalline, or polycrystalline.

The separation layer 302 can be formed by a sputtering method, a plasma CVD method, a coating method, a printing method, or the like. Note that a coating method includes a spin coating method, a droplet discharge method, and a dispensing method.

In the case where the separation layer 302 has a single-layer structure, it is preferable to form a tungsten layer, a molybdenum layer, or a layer containing a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In the case where the separation layer 302 has a stack structure, a tungsten layer, a molybdenum layer, or a layer containing a mixture of tungsten and molybdenum is preferably formed as a first layer. An oxide of tungsten, molybdenum, or a mixture of tungsten and molybdenum; a nitride of tungsten, molybdenum, or a mixture of tungsten and molybdenum; an oxynitride of tungsten, molybdenum, or a mixture of tungsten and molybdenum; or a nitride oxide of tungsten, molybdenum, or a mixture of tungsten and molybdenum is preferably formed as a second layer.

In the case where a stack structure of a layer containing tungsten and a layer containing an oxide of tungsten is formed as the separation layer 302, the layer containing tungsten may be formed first, which is followed by the formation of an insulating layer formed using an oxide over the layer containing tungsten so that a layer containing an oxide of tungsten is formed at the interface between the layer containing tungsten and the insulating layer.

In addition, in the case where the transistor is formed over the manufacturing substrate with the separation layer therebetween, the separation layer is heated by heat treatment for dehydration or dehydrogenation of an oxide semiconductor layer. Thus, when separation of the transistor from the manufacturing substrate and transfer thereof to a supporting substrate are performed in a later process, separation at the interface of the separation layer can be easily performed.

Alternatively, the layer containing an oxide of tungsten may be formed by performing thermal oxidation treatment, oxygen plasma treatment, treatment with a highly oxidizing solution such as ozone water, or the like on the surface of the layer containing tungsten. The plasma treatment and the heat treatment may be performed in an atmosphere of oxygen, nitrogen, or dinitrogen monoxide alone, or a mixed gas of any of these gasses and another gas. The same can be applied to the case of forming a layer containing a nitride, an oxynitride, or a nitride oxide of tungsten. After a layer containing tungsten is formed, a silicon nitride layer, a silicon oxynitride layer, or a silicon nitride oxide layer may be formed thereover.

Figure 4A:
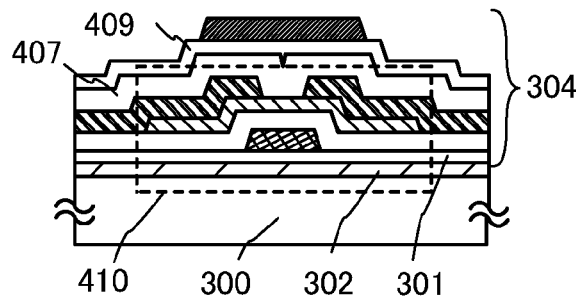
FIGS. 4A to 4D illustrate an embodiment of a method for manufacturing a semiconductor device.

A layer 304 to be separated is formed over the separation layer 302 (see FIG. 4A). The layer 304 to be separated includes the first insulating layer 301 and a transistor 410.

First, the first insulating layer 301 is formed over the separation layer 302. The first insulating layer 301 is preferably formed with a single-layer or a multilayer using an insulating film containing nitrogen and silicon, such as silicon nitride, silicon oxynitride, or silicon nitride oxide.

Further, the first insulating layer 301 can be formed by a sputtering method, a plasma CVD method, a coating method, a printing method, or the like. For example, the first insulating layer 301 is formed by a plasma CVD method at a temperature of 250° C. to 400° C., whereby a dense film having very low water permeability can be obtained. Note that the first insulating layer 301 is formed to a thickness of greater than or equal to 10 nm and less than or equal to 1000 nm, preferably greater than or equal to 100 nm and less than or equal to 700 nm.

By forming the first insulating layer 301, separation can be easily performed at the interface between the layer 304 to be separated and the separation layer 302 in a later separation process. Further, a semiconductor element or a wiring can be prevented from being cracked or damaged in the later separation process. The first insulating layer 301 serves as a protective layer of a semiconductor device.

The transistor 410 is formed over the first insulating layer 301, so that the layer 304 to be separated is formed. The layer 304 to be separated can be formed using the method described in Embodiment 1; accordingly, a detailed description thereof is omitted here.

In this embodiment, an example in which a protective insulating layer 409 is stacked over an insulating layer 407 is described. In this embodiment, as the protective insulating layer 409, a silicon nitride film is formed in such a manner that the substrate 400 over which layers up to and including the insulating layer 407 are formed is heated to a temperature of 100° C. to 400° C., a sputtering gas containing high-purity nitrogen from which hydrogen and moisture are removed is introduced, and a target of a silicon semiconductor is used (see FIG. 4A). In this case, the protective insulating layer 409 is preferably formed while removing moisture remaining in a treatment chamber, in a manner similar to that of the insulating layer 407.

A planarization insulating film may be formed over the transistor 410 in order to reduce surface roughness caused by the transistor. As the planarization insulating film, an organic material such as polyimide, acrylic, or benzocyclobutene can be used. Other than such an organic material, it is also possible to use a low-dielectric constant material (a low-k material) or the like. Note that the planarization insulating film may be formed by stacking a plurality of insulating films formed from these materials.

Next, a second manufacturing substrate 306 is temporarily attached to the layer 304 to be separated using an adhesive layer 305 which can be removed. By attaching the second manufacturing substrate 306 to the layer 304 to be separated, the layer 304 to be separated can be easily separated from the separation layer 302. In addition, it is possible to lower the stress added to the layer 304 to be separated in the separation process, and the transistor can be protected. Further, since the adhesive layer 305 which can be removed is used, the second manufacturing substrate 306 can be easily removed when it is not needed any more.

As the adhesive layer 305 which can be removed, for example, a water-soluble resin can be used. Unevenness of the layer 304 to be separated is reduced by applying the water soluble-resin, so that the layer 304 to be separated can be easily attached to the second manufacturing substrate 306. In addition, as the adhesive layer 305 which can be removed, a stack of a water-soluble resin and an adhesive capable of being separated by light or heat may be used.

Figure 4B:
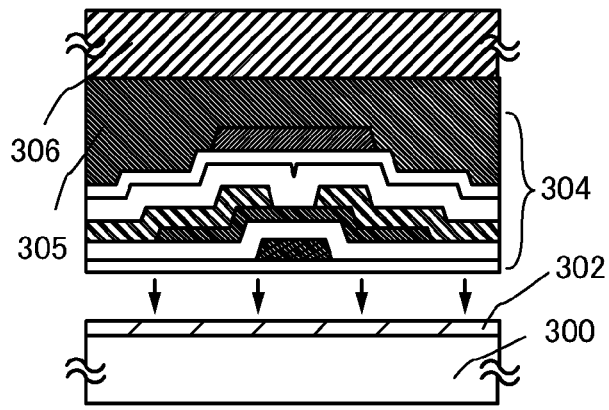

Next, the layer 304 to be separated is separated from the first manufacturing substrate 300 (see FIG. 4B). As a separation method, various methods can be employed.

For example, when a metal oxide film is formed as the separation layer 302 on the side that is in contact with the first insulating layer 301, the layer 304 to be separated can be separated from the first manufacturing substrate 300 by weakening the metal oxide film by crystallization. In addition, after the metal oxide film is weakened by crystallization, part of the separation layer 302 may be removed by etching using a solution or a halogen fluoride gas such as $NF_3$, $BrF_3$, or $ClF_3$ and separation may be performed at the weakened metal oxide film.

When a film containing nitrogen, oxygen, hydrogen, or the like (e.g., an amorphous silicon film containing hydrogen, an alloy film containing hydrogen, or an alloy film containing oxygen) is used as the separation layer 302 and a substrate having a light-transmitting property is used as the first manufacturing substrate 300, the following method can be used: the separation layer 302 is irradiated with laser light through the first manufacturing substrate 300, and nitrogen, oxygen, or hydrogen contained in the separation layer is evaporated, so that separation can occur between the first manufacturing substrate 300 and the separation layer 302.

Further, by removing the separation layer 302 by etching, the layer 304 to be separated may be separated from the first manufacturing substrate 300.

It is also possible to use a method for removing the first manufacturing substrate 300 by mechanical polishing, a method for removing the first manufacturing substrate 300 by etching using a halogen fluoride gas such as $NF_3$, $BrF_3$ or $ClF_3$, or HF, or the like. In this case, the separation layer 302 is not necessarily used.

Moreover, the layer 304 to be separated can be separated from the first manufacturing substrate 300 in the following manner: a groove to expose the separation layer 302 is formed by laser light irradiation, by etching using a gas, a solution, or the like, or with a sharp knife or scalpel, so that separation occurs along the interface between the separation layer 302 and the first insulating layer 301 serving as a protective layer, with the groove used as a trigger.

For example, as a separation method, mechanical force (separation treatment with a human hand or with a gripper, separation treatment by rotation of a roller, or the like) may be used. Alternatively, a liquid may be dropped into the groove to allow the liquid to infiltrate into the interface between the separation layer 302 and the first insulating layer 301, which may be followed by the separation of the layer 304 to be separated from the separation layer 302. Further alternatively, a method may be used in which a fluoride gas such as $NF_3$, $BrF_3$, or $ClF_3$ is introduced into the groove and the separation layer 302 is removed by etching with the use of the fluoride gas so that the layer 304 to be separated is separated from the first manufacturing substrate 300 having an insulating surface. Further, the separation may be performed while pouring a liquid such as water during the separation.

As another separation method, if the separation layer 302 is formed using tungsten, separation can be performed while the separation layer is being etched by using a mixed solution of ammonia water and hydrogen peroxide.

Figure 4C:
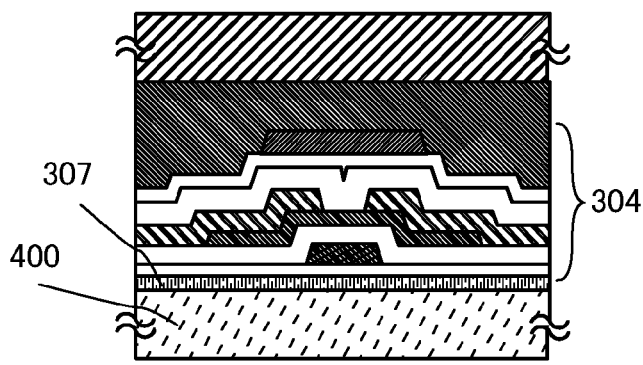

Next, a substrate 400 is attached to the layer 304 to be separated using a resin layer 307 (see FIG. 4C).

As the substrate 400, a flexible substrate as described in Embodiment 1 can be used.

As the resin layer 307, various curable adhesives, e.g., a light curable adhesive such as a UV curable adhesive, a reactive curable adhesive, a thermal curable adhesive, and an anaerobic adhesive can be used. As the material of the adhesive, an epoxy resin, an acrylic resin, a silicone resin, a phenol resin, or the like can be used.

Note that in the case where a prepreg is used as the substrate 400, the layer 304 to be separated and the substrate 400 are directly attached to each other by pressure bonding without using an adhesive. At this time, as an organic resin for a structure body, a reactive curable resin, a thermal curable resin, a UV curable resin, or the like which is better cured by additional treatment is preferably used.

Figure 4D:
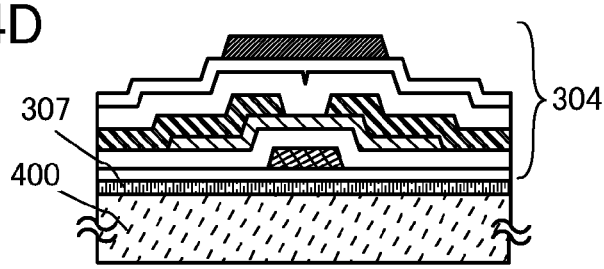

After providing the substrate 400, the second manufacturing substrate 306 and the adhesive layer 305 which can be removed are removed, whereby the transistor 410 is exposed (see FIG. 4D).

Through the above process, the transistor 410 can be formed over the substrate 400 by a transfer process.

Note that this embodiment shows an example of the method in which components up to and including the transistor are provided as the layer to be separated; however, the invention disclosed in this specification is not limited thereto. The separation and transfer may be performed after a display element (e.g., a light-emitting element) is formed.

According to this embodiment, a transistor manufactured using a substrate having high heat resistance can be transferred to a flexible substrate which is thin and lightweight. Therefore, a flexible semiconductor device can be formed without being restricted by the heat resistance of the substrate.

This embodiment can be implemented by being combined with any of other embodiments as appropriate.

Embodiment 5

A semiconductor device with a display function (also referred to as a display device) can be manufactured using the transistor an example of which is described in any of Embodiments 1 to 4. The transistor an example of which is described in any of Embodiments 1 to 4 is more effectively used for a driver circuit portion. Further, by using the transistor, part or whole of a driver circuit can be formed over the same substrate as a pixel portion, whereby a system-on-panel can be obtained.

Figure 6A:
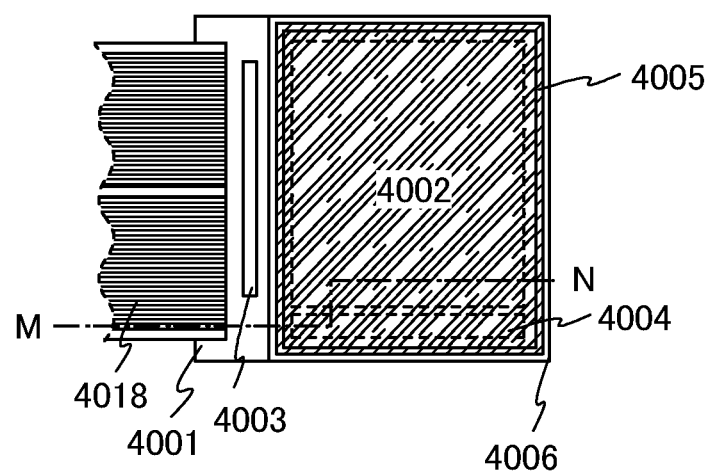
FIGS. 6A and 6B each illustrate an embodiment of a semiconductor device.
Figure 6B:
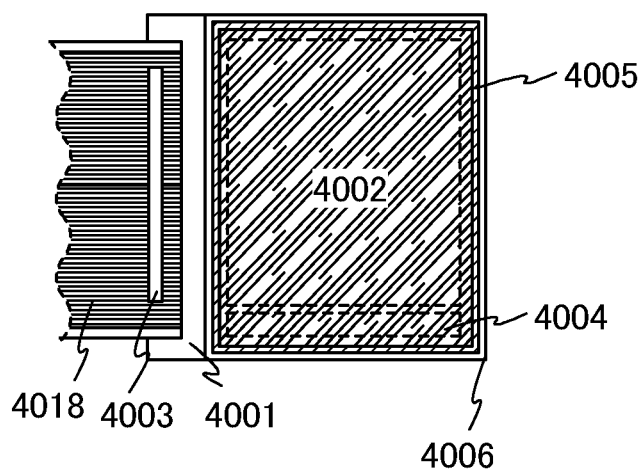

In FIGS. 6A and 6B, a sealant 4005 is provided so as to surround a pixel portion 4002 and a scan line driver circuit 4004 which are provided over a first substrate 4001. A second substrate 4006 is provided over the pixel portion 4002 and the scan line driver circuit 4004. Therefore, the pixel portion 4002 and the scan line driver circuit 4004 as well as a display element are sealed by the first substrate 4001, the sealant 4005, and the second substrate 4006. In FIGS. 6A and 6B, a signal line driver circuit 4003 which is formed over a substrate separately prepared using a single crystal semiconductor film or a polycrystalline semiconductor film is mounted in a region which is different from the region surrounded by the sealant 4005 over the first substrate 4001. In FIGS. 6A and 6B, various signals and potential are supplied to the signal line driver circuit 4003 which is separately formed, the scan line driver circuit 4004, and the pixel portion 4002 from an FPC 4018.

Although FIGS. 6A and 6B each illustrate the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not limited to a particular method, and a chip on glass (COG) method, a wire bonding method, a tape automated bonding (TAB) method, or the like can be used. FIG. 6A illustrates the example in which the signal line driver circuit 4003 is mounted by a COG method. FIG. 6B illustrates the example in which the signal line driver circuit 4003 is mounted by a TAB method.

In addition, a display device includes in its category a panel in which a display element is sealed, and a module in which an IC and the like including a controller are mounted on a panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion and the scan line driver circuit which are provided over the first substrate each include a plurality of transistors, and the transistor an example of which is described in any of Embodiments 1 to 4 can be used as the transistor for the scan line driver circuit 4004.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 7:
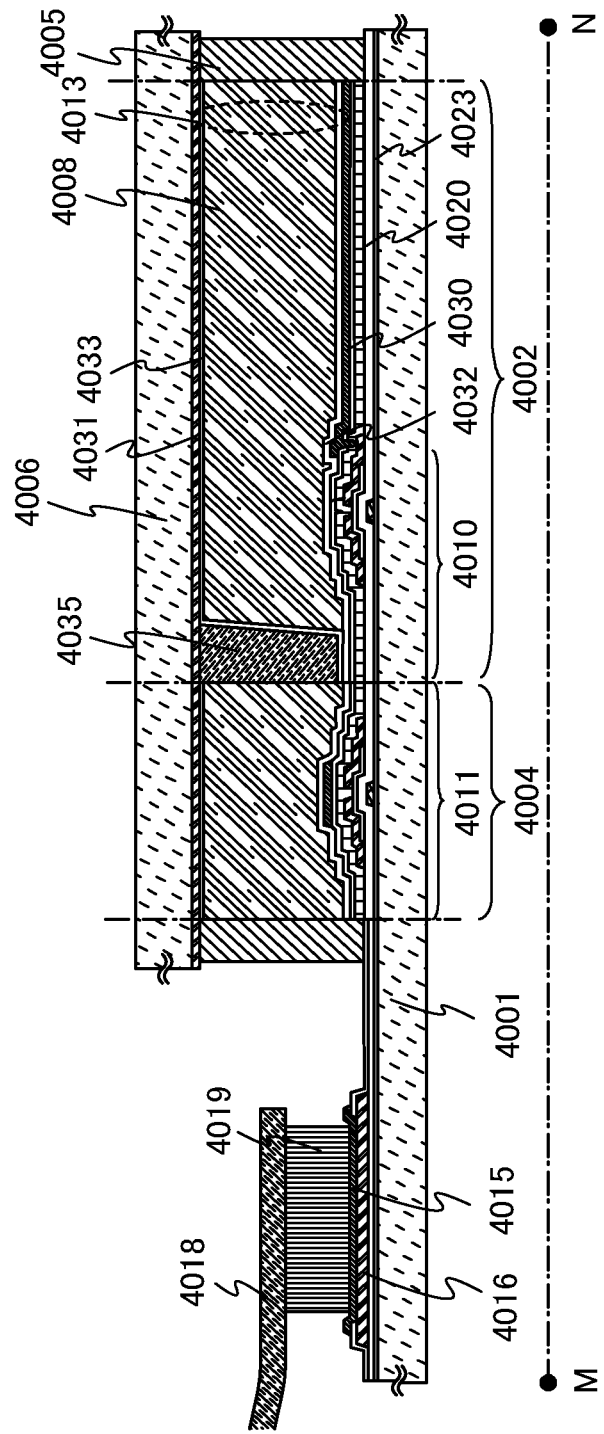
FIG. 7 illustrates an embodiment of a semiconductor device.
Figure 8:
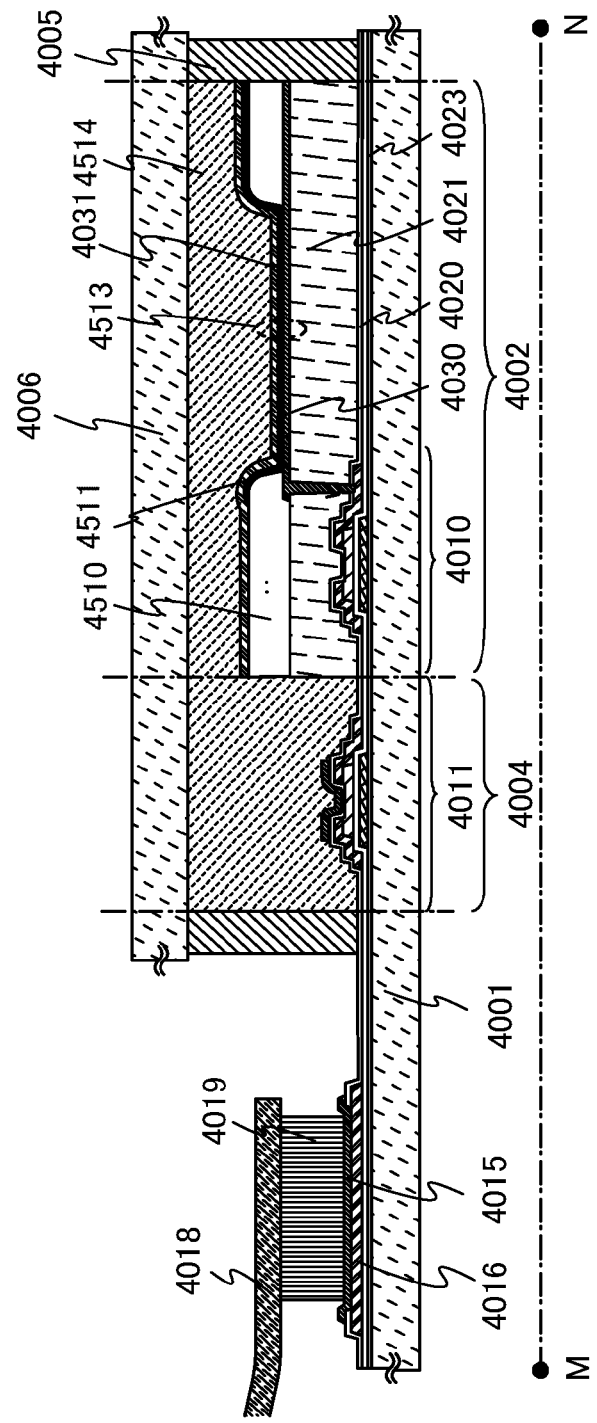
FIG. 8 illustrates an embodiment of a semiconductor device.
Figure 9:
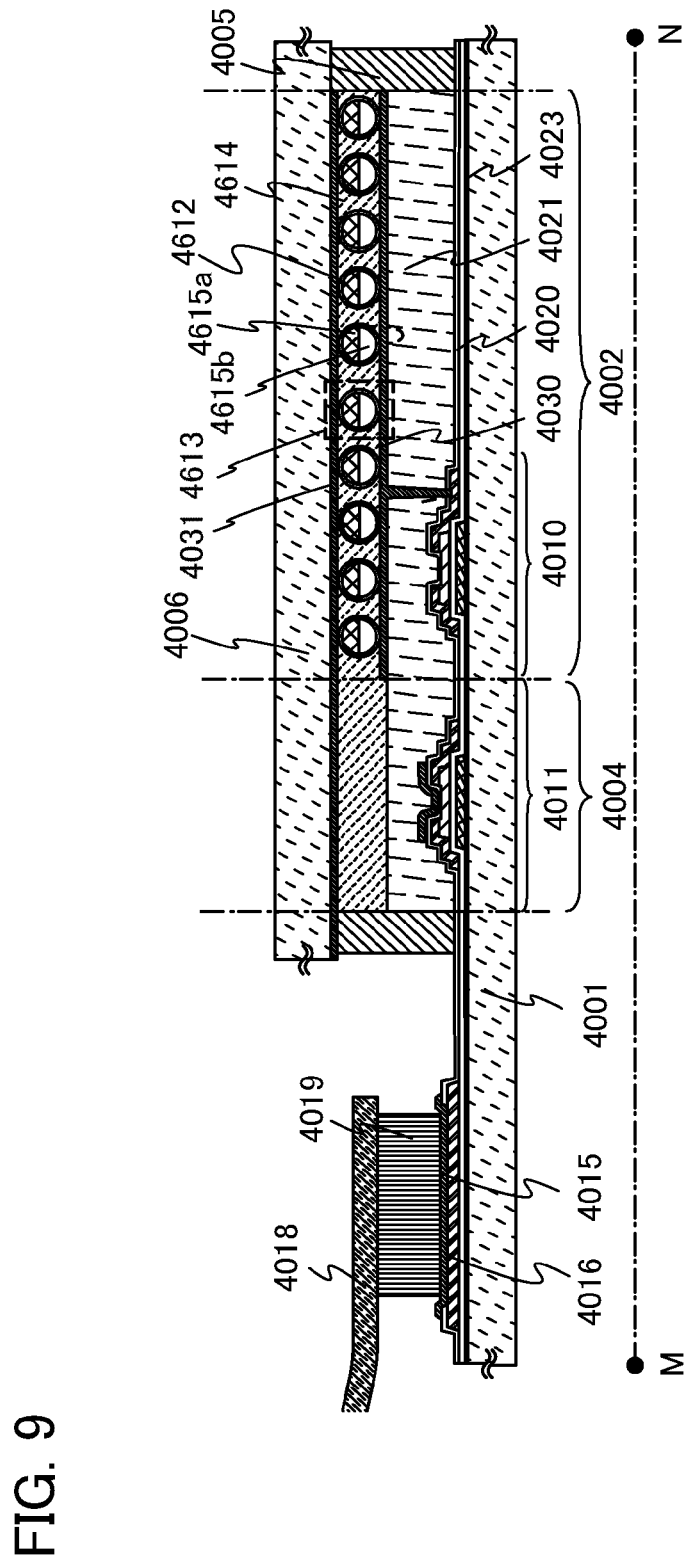
FIG. 9 illustrates an embodiment of a semiconductor device.

Embodiments of a semiconductor device will be described with reference to FIG. 7, FIG. 8, and FIG. 9. FIG. 7, FIG. 8, and FIG. 9 each corresponds to a cross-sectional view along M-N in FIG. 6A.

As illustrated in FIG. 7, FIG. 8, and FIG. 9, a semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrode layers of transistors 4010 and 4011.

Each of the pixel portion 4002 and the scan line driver circuit 4004 which are provided over the first substrate 4001 includes a plurality of transistors. In FIG. 7, FIG. 8, and FIG. 9, the transistor 4010 included in the pixel portion 4002 and the transistor 4011 included in the scan line driver circuit 4004 are illustrated as an example. In FIG. 7, an insulating layer 4020 is provided over the transistors 4010 and 4011, and in FIG. 8 and FIG. 9, an insulating layer 4021 is provided over the insulating layer 4020. Note that an insulating film 4023 is an insulating film serving as a base film.

In this embodiment, for the transistor 4011 included in the scan line driver circuit 4004, a transistor an example of which is described in Embodiment 1 is used. In the transistor 4011, a channel formation region of an oxide semiconductor layer is surrounded by a gate electrode layer, a gate insulating layer, an insulating layer, and a conductive layer provided below and over the oxide semiconductor layer in a channel width direction. In a driver circuit, it is preferable that a transistor have a long channel width so that a larger amount of current can flow. Therefore, with the use of a transistor which has resistance to bending in the channel width direction as described in any of Embodiments 1 to 4, a highly impact-resistant and highly reliable semiconductor device can be obtained.

The transistor 4010 included in the pixel portion 4002 is electrically connected to a display element to form a display panel. A variety of display elements can be used as the display element as long as display can be performed.

FIG. 7 illustrates an example of a liquid crystal display device using a liquid crystal element for a display element. In FIG. 7, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

Reference numeral 4035 indicates a columnar spacer formed by selectively etching an insulating film. The columnar spacer 4035 is provided in order to control the thickness of the liquid crystal layer 4008 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition containing a chiral material at higher than or equal to 5 wt. % is used for the liquid crystal layer in order to improve the temperature range. The liquid crystal composition containing a liquid crystal exhibiting a blue phase and a chiral agent has a short response time of shorter than or equal to 1 msec, has optical isotropy, which makes an alignment process unneeded, and has a small viewing angle dependence. In addition, since an alignment film does not need to be provided and thus rubbing treatment is unnecessary, electrostatic discharge damage caused by the rubbing treatment can be prevented and defects and damage of a liquid crystal display device can be reduced in the manufacturing process. Thus, productivity of the liquid crystal display device can be increased. A transistor that includes an oxide semiconductor layer particularly has a possibility that electric characteristics of the transistor may fluctuate significantly by the influence of static electricity and deviate from the designed range. Therefore, it is more effective to use a blue phase liquid crystal material for a liquid crystal display device including a transistor including an oxide semiconductor layer.

The specific resistivity of the liquid crystal material is higher than or equal to $1 \times 10^9$ $\Omega \cdot$cm, preferably higher than or equal to $1 \times 10^{11}$ $\Omega \cdot$cm, more preferably higher than or equal to $1 \times 10^{12}$ $\Omega \cdot$cm. Note that the specific resistivity in this specification is measured at 20° C.

The size of a storage capacitor formed in the liquid crystal display device is set considering the leakage current of the transistor provided in the pixel portion or the like so that electric charge can be held for a predetermined period. The size of the storage capacitor may be set considering the off-state current of the transistor or the like. By using a transistor including a high-purity oxide semiconductor layer, it is enough to provide a storage capacitor having a capacitance that is less than or equal to ⅓, preferably less than or equal to ⅕ of a liquid crystal capacitance of each pixel.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

In addition, the liquid crystal display device may be a normally black liquid crystal display device such as a transmissive liquid crystal display device utilizing a vertical alignment (VA) mode. Some examples are given as the vertical alignment mode; for example, a multi-domain vertical alignment (MVA) mode, a patterned vertical alignment (PVA) mode, an ASV mode, or the like can be employed. Furthermore, this embodiment can be applied to a VA liquid crystal display device. The VA liquid crystal display device has a kind of form in which alignment of liquid crystal molecules of a liquid crystal display panel is controlled as follows. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in different regions.

Further, in the display device, a black matrix (a light-blocking layer), an optical member (an optical substrate) such as a polarizing member, a retardation member, or an anti-reflection member, and the like are provided as appropriate. For example, circular polarization obtained by using a polarizing substrate and a retardation substrate may be used. In addition, a backlight, a side light, or the like may be used as a light source.

As a display method for the pixel portion, a progressive method, an interlace method, or the like can be employed. Further, color elements controlled in a pixel at the time of color display are not limited to a combination of three colors: R, G, and B (R, G, and B correspond to red, green, and blue, respectively). For example, a combination of R, G, B, and W (W corresponds to white); a combination of R, G, B, and one or more of yellow, cyan, magenta, and the like; or the like can be used. Further, the sizes of display regions may be different depending on dots of color elements. The present invention is not limited to a display device for color display but can also be applied to a display device for monochrome display.

In addition, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

As for the organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer in which particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that an example of an organic EL element is described here as a light-emitting element.

In order to extract light emitted from the light-emitting element, at least one of a pair of electrodes may be transparent. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

FIG. 8 illustrates an example of a light-emitting device in which a light-emitting element is used as a display element. A light-emitting element 4513 which is a display element is electrically connected to the transistor 4010 provided in the pixel portion 4002. Note that the structure of the light-emitting element 4513 is, but not limited to, a stack structure which includes the first electrode layer 4030, an electroluminescent layer 4511, and a second electrode layer 4031. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that the light-emitting device be packaged (sealed) with a protective film (such as a laminate film or an ultraviolet curable resin film) or a cover material with high air-tightness and little degasification so that the light-emitting device is not exposed to the outside air, in this manner.

As the filler 4514, an ultraviolet curable resin or a thermosetting resin as well as an inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

In addition, if needed, an optical film such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce reflection can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the first and second particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless) from each other.

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material thereof.

Further, as the electronic paper, a display device in which a twisting ball display system is employed can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 9 illustrates an active matrix electronic paper as an embodiment of a semiconductor device. The electronic paper in FIG. 9 is an example of a display device using a twisting ball display system.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIG. 7, FIG. 8, and FIG. 9, as the first substrate 4001 and the second substrate 4006, flexible substrates, for example, plastic substrates having a light-transmitting property or the like can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 4020 functions as a protective film of the transistors.

Note that the protective film is provided to prevent entry of contaminant impurities such as an organic substance, metal, or water vapor contained in the air and is preferably a dense film. The protective film may be formed with a single layer or a stack using one or more of a silicon oxide film, a silicon nitride film, a silicon oxynitride film, a silicon nitride oxide film, an aluminum oxide film, an aluminum nitride film, an aluminum oxynitride film, and an aluminum nitride oxide film by a sputtering method.

The insulating layer 4021 functioning as a planarization insulating film can be formed using an organic material having heat resistance, such as acrylic, polyimide, benzocyclobutene, polyamide, or epoxy. Other than such organic materials, it is also possible to use a low-dielectric constant material (a low-k material), a siloxane-based resin, phosphosilicate glass (PSG), borophosphosilicate glass (BPSG), or the like. The insulating layer may be formed by stacking a plurality of insulating films formed of these materials.

There is no particular limitation on the method for forming the insulating layers 4020 and 4021, and the insulating layers 4020 and 4021 can be formed, depending on the material, by a sputtering method, an SOG method, spin coating, dipping, spray coating, or a droplet discharge method (such as an inkjet method, screen printing, or offset printing), or with a tool such as a doctor knife, a roll coater, a curtain coater, or a knife coater.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (also referred to as the pixel electrode layer, the common electrode layer, the counter electrode layer, or the like) for applying voltage to the display element may have light-transmitting properties or light-reflecting properties, depending on the direction in which light is extracted, the position where the electrode layer is provided, and the pattern structure of the electrode layer.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter also referred to as ITO), indium zinc oxide, or indium tin oxide to which silicon oxide is added.

The first electrode layer 4030 and the second electrode layer 4031 can each be formed using one kind or plural kinds of materials selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, or the like can be given.

Since the transistor is easily broken owing to static electricity or the like, a protective circuit for protecting the driver circuit is preferably provided. The protective circuit is preferably formed using a nonlinear element.

By using any of the transistors described in Embodiments 1 to 4 as described above, the display device can have a variety of functions.

This embodiment can be implemented by being combined with any of other embodiments as appropriate.

Embodiment 6

A semiconductor device disclosed in this specification can be applied to a variety of electronic devices (including an amusement machine). Examples of the electronic device include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, and a large-sized game machine such as a pachinko machine.

Figure 10A:
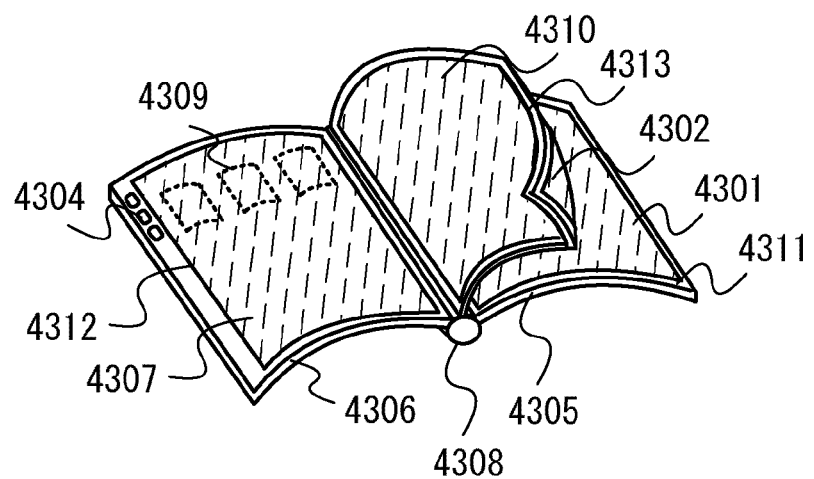
FIGS. 10A and 10B illustrate an electronic device.
Figure 10B:
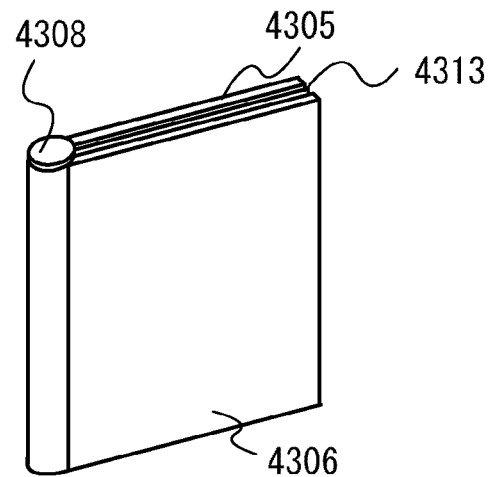

FIGS. 10A and 10B illustrate an example of an electronic book reader to which a flexible semiconductor device formed according to any of the above embodiments is applied. FIG. 10A illustrates an opened electronic book reader, and FIG. 10B illustrates a closed electronic book reader. The flexible semiconductor device formed according to any of the above embodiments can be used for a first display panel 4311, a second display panel 4312, and a third display panel 4313.

A first housing 4305 has the first display panel 4311 including a first display portion 4301, a second housing 4306 has the second display panel 4312 including an operation portion 4304 and a second display portion 4307. The third display panel 4313 is a dual display panel and has a third display portion 4302 and a fourth display portion 4310. The third display panel 4313 is interposed between the first display panel 4311 and the second display panel 4312. The first housing 4305, the first display panel 4311, the third display panel 4313, the second display panel 4312, and the second housing 4306 are connected to each other with a binding portion 4308 in which a driver circuit is formed. The electronic book reader of FIGS. 10A and 10B includes four display screens: the first display portion 4301, the second display portion 4307, the third display portion 4302, and the fourth display portion 4310.

The first housing 4305, the first display panel 4311, the third display panel 4313, the second display panel 4312, and the second housing 4306 are flexible, and the flexibility of the electronic book reader is high. Further, when a plastic substrate is used for each of the first housing 4305 and the second housing 4306, and a thin film is used for the third display panel 4313, a thin electronic book reader can be obtained.

The third display panel 4313 is a dual display panel including the third display portion 4302 and the fourth display portion 4310. For the third display panel 4313, either a display panel of dual emission type, or display panels of one-side emission type which are attached to each other may be used.

Figure 11:
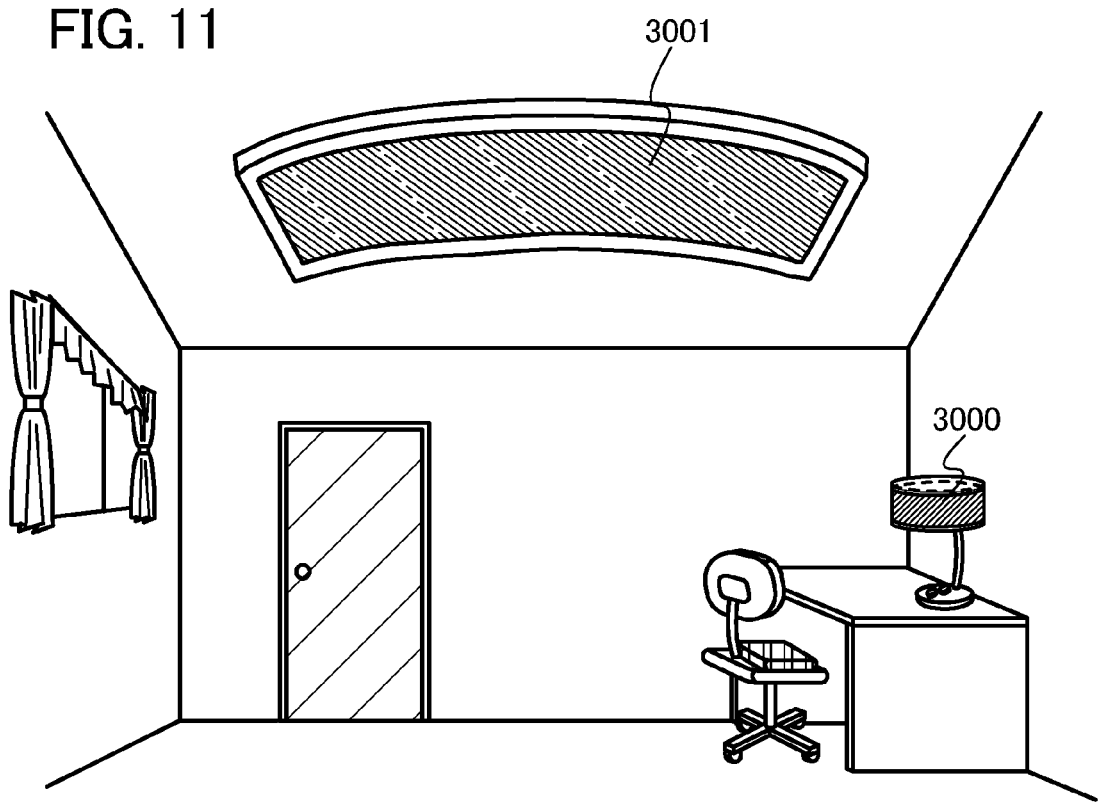
FIG. 11 illustrates an electronic device.

FIG. 11 illustrates an example in which a semiconductor device formed in accordance with any of the above embodiments is used for an indoor lighting device 3001. Since the semiconductor device described in any of the above embodiments can be increased in area, the semiconductor device can be used for a lighting device having a large area. Further, the semiconductor device described in any of the above embodiments can be used for a desk lamp 3000. Note that a lighting device includes, in its category, a wall light, a light for an inside of a car, an evacuation light, and the like in addition to a ceiling light and a desk lamp.

In such a manner, the semiconductor device described in any of Embodiments 1 to 5 can be applied to various electronic devices described above, and highly reliable electronic devices can be provided.

This application is based on Japanese Patent Application serial no. 2010-024385 filed with Japan Patent Office on Feb. 5, 2010, the entire contents of which are hereby incorporated by reference.

REFERENCE NUMERALS

300: manufacturing substrate, 301: insulating layer, 302: separation layer, 304: layer to be separated, 305: adhesive layer, 306: manufacturing substrate, 307: resin layer, 400: substrate, 401: gate electrode layer, 402: gate insulating layer, 403: oxide semiconductor layer, 405a: source electrode layer, 405b: drain electrode layer, 407: insulating layer, 409: protective insulating layer, 410: transistor, 411: conductive layer, 412a: opening, 412b: opening, 420a: transistor, 420b: transistor, 420c: transistor, 421: gate electrode layer, 422: gate insulating layer, 422a: gate insulating layer, 422b: gate insulating layer, 422c: gate insulating layer, 423a: oxide semiconductor layer, 423b: oxide semiconductor layer, 423c: oxide semiconductor layer, 425a: source electrode layer, 425b: drain electrode layer, 427: insulating layer, 427a: insulating layer, 427b: insulating layer, 427c: insulating layer, 430: transistor, 431: conductive layer, 440: oxide semiconductor film, 441: oxide semiconductor layer, 445: arrow, 3000: desk lamp, 3001: indoor lighting device, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive film, 4020: insulating layer, 4021: insulating layer, 4023: insulating film, 4030: electrode layer, 4031: electrode layer, 4032: insulating film, 4301: display portion, 4302: display portion, 4304: operation portion, 4305: housing, 4306: housing, 4307: display portion, 4308: binding portion, 4310: display portion, 4311: display panel, 4312: display panel, 4313: display panel, 4510: partition wall, 4511: electroluminescent layer, 4513: light-emitting element, 4514: filler, 4612: cavity, 4613: spherical particle, 4614: filler, 4615a: black region, 4615b: white region

What is claimed is:

1. A semiconductor device comprising a transistor, the transistor comprising:
a first conductive layer;
a first insulating layer over the first conductive layer;
an oxide semiconductor layer over the first insulating layer;
a second insulating layer over the oxide semiconductor layer; and
a second conductive layer over the second insulating layer,
wherein the oxide semiconductor layer overlaps with the first conductive layer and the second conductive layer,
wherein each of the first conductive layer and the second conductive layer extends beyond both side edges of the oxide semiconductor layer in a channel width direction of the transistor,
wherein the oxide semiconductor layer is surrounded by the first insulating layer and the second insulating layer, and
wherein a channel width of the transistor is larger than a channel length of the transistor.

2. The semiconductor device according to claim 1, wherein the semiconductor device is a display device.

3. The semiconductor device according to claim 1, wherein the transistor is included in a driver circuit.

4. The semiconductor device according to claim 1, wherein a carrier concentration of a channel formation region of the transistor is lower than $1\times10^{11}/cm^3$.

5. The semiconductor device according to claim 1, wherein the transistor comprises:
a source electrode over and electrically connected with the oxide semiconductor layer; and
a drain electrode over and electrically connected with the oxide semiconductor layer.

6. The semiconductor device according to claim 1, wherein the second conductive layer is in contact with and electrically connected to the first conductive layer.

7. A semiconductor device comprising a transistor, the transistor comprising:
a first conductive layer;
a first insulating layer over the first conductive layer;
an oxide semiconductor layer formed over the first insulating layer in a state where a substrate over which the first conductive layer is formed is heated;
a second insulating layer over the oxide semiconductor layer; and
a second conductive layer over the second insulating layer,
wherein the oxide semiconductor layer overlaps with the first conductive layer and the second conductive layer,
wherein each of the first conductive layer and the second conductive layer extends beyond both side edges of the oxide semiconductor layer in a channel width direction of the transistor,
wherein the oxide semiconductor layer is surrounded by the first insulating layer and the second insulating layer,
wherein a channel width of the transistor is larger than a channel length of the transistor, and
wherein the oxide semiconductor layer is dehydrated or dehydrogenated and then oxygen is supplied to the oxide semiconductor layer.

8. The semiconductor device according to claim 7, wherein the semiconductor device is a display device.

9. The semiconductor device according to claim 7, wherein the transistor is included in a driver circuit.

10. The semiconductor device according to claim 7, wherein a carrier concentration of a channel formation region of the transistor is lower than $1\times10^{11}/cm^3$.

11. The semiconductor device according to claim 7, wherein the transistor comprises:
a source electrode over and electrically connected with the oxide semiconductor layer; and a drain electrode over and electrically connected with the oxide semiconductor layer.

12. The semiconductor device according to claim 7, wherein the second conductive layer is in contact with and electrically connected to the first conductive layer.

13. A semiconductor device comprising a transistor, the transistor comprising:
   a first conductive layer;
   a first insulating layer;
   an oxide semiconductor layer over the first insulating layer; and
   a second insulating layer over the oxide semiconductor layer,
   wherein the oxide semiconductor layer overlaps with the first conductive layer,
   wherein the first conductive layer extends beyond both side edges of the oxide semiconductor layer in a channel width direction of the transistor,
   wherein the oxide semiconductor layer is surrounded by the first insulating layer and the second insulating layer, and
   wherein a channel width of the transistor is larger than a channel length of the transistor.

14. The semiconductor device according to claim 13, wherein the first conductive layer comprises a first region overlapping with the oxide semiconductor layer and a second region not overlapping with the oxide semiconductor layer, and
   wherein a length of the second region in a direction perpendicular to an extending direction of the first conductive layer is longer than a length of the first region in a direction perpendicular to the extending direction of the first conductive layer.

15. The semiconductor device according to claim 14, wherein the semiconductor device is a display device.

16. The semiconductor device according to claim 14, wherein the transistor is included in a driver circuit.

17. The semiconductor device according to claim 14, wherein a carrier concentration of a channel formation region of the transistor is lower than $1\times10^{11}/cm^3$.

18. The semiconductor device according to claim 14, wherein the transistor comprises:
   a source electrode over and electrically connected with the oxide semiconductor layer; and
   a drain electrode over and electrically connected with the oxide semiconductor layer.

19. The semiconductor device according to claim 14, further comprising a second conductive layer in contact with and electrically connected to the first conductive layer.

20. The semiconductor device according to claim 14, wherein the first conductive layer is located under the oxide semiconductor layer.

21. A semiconductor device comprising a transistor, the transistor comprising:
   a first conductive layer;
   a first insulating layer;
   an oxide semiconductor layer over the first insulating layer; and
   a second insulating layer over the oxide semiconductor layer,
   wherein the oxide semiconductor layer overlaps with the first conductive layer,
   wherein the first conductive layer extends beyond both side edges of the oxide semiconductor layer in a channel width direction of the transistor,
   wherein the first conductive layer comprises a first region, a second region adjacent to the first region, and a third region adjacent to the second region, the second region being interposed between the first region and the third region,
   wherein the first region does not overlap with the oxide semiconductor layer, the second region overlaps with the oxide semiconductor layer, and the third region does not overlap with the oxide semiconductor layer, and
   wherein a length of the second region in a direction perpendicular to an extending direction of the first conductive layer is shorter than a length of the first region in a direction perpendicular to the extending direction of the first conductive layer and shorter than a length of the third region in a direction perpendicular to the extending direction of the first conductive layer.

22. The semiconductor device according to claim 21, wherein the semiconductor device is a display device.

23. The semiconductor device according to claim 21, wherein the transistor is included in a driver circuit.

24. The semiconductor device according to claim 21, wherein a carrier concentration of a channel formation region of the transistor is lower than $1\times10^{11}/cm^3$.

25. The semiconductor device according to claim 21, wherein the transistor comprises:
   a source electrode over and electrically connected with the oxide semiconductor layer; and
   a drain electrode over and electrically connected with the oxide semiconductor layer.

26. The semiconductor device according to claim 21, further comprising a second conductive layer in contact with and electrically connected to the first conductive layer.

27. The semiconductor device according to claim 21, wherein the first conductive layer is located under the oxide semiconductor layer.

28. The semiconductor device according to claim 21, wherein a channel width of the transistor is larger than a channel length of the transistor.

29. A semiconductor device comprising a pixel portion, wherein the pixel portion comprises a transistor, and the transistor comprises:
   a first conductive layer;
   a first insulating layer over the first conductive layer;
   an oxide semiconductor layer over the first insulating layer; and
   a second insulating layer over the oxide semiconductor layer,
   wherein the oxide semiconductor layer overlaps with the first conductive layer,
   wherein the first conductive layer extends beyond both side edges of the oxide semiconductor layer in a channel width direction of the transistor, and
   wherein the oxide semiconductor layer comprises a crystal region which is c-axis-aligned perpendicularly to a surface of the oxide semiconductor layer.

30. The semiconductor device according to claim 29, wherein the transistor comprises:
   a source electrode in contact with a top surface of the oxide semiconductor layer and a side surface of the oxide semiconductor layer;
   a drain electrode in contact with a top surface of the oxide semiconductor layer and a side surface of the oxide semiconductor layer; and
   a second conductive layer over the second insulating layer.

31. The semiconductor device according to claim 29, wherein a channel width of the transistor is larger than a channel length of the transistor.

32. The semiconductor device according to claim 29,
wherein the first conductive layer comprises a first region, a second region adjacent to the first region, and a third region adjacent to the second region, the second region being interposed between the first region and the third region, wherein the first region does not overlap with the oxide semiconductor layer, the second region overlaps with the oxide semiconductor layer, and the third region does not overlap with the oxide semiconductor layer, and wherein a length of the second region in a direction perpendicular to an extending direction of the first conductive layer is shorter than a length of the first region in a direction perpendicular to the extending direction of the first conductive layer and shorter than a length of the third region in a direction perpendicular to the extending direction of the first conductive layer.

33. A semiconductor device comprising a pixel portion,
wherein the pixel portion comprises a transistor, and the transistor comprises:

a first conductive layer;

a first insulating layer over the first conductive layer;

an oxide semiconductor layer over the first insulating layer;

a source electrode in contact with a top surface of the oxide semiconductor layer and a side surface of the oxide semiconductor layer;

a drain electrode in contact with a top surface of the oxide semiconductor layer and a side surface of the oxide semiconductor layer; and a second insulating layer over the oxide semiconductor layer, the source electrode, and the drain electrode, wherein the oxide semiconductor layer overlaps with the first conductive layer, wherein the first conductive layer extends beyond both side edges of the oxide semiconductor layer in a channel width direction of the transistor, wherein the second insulating layer is in contact with a top surface of the oxide semiconductor layer, wherein the oxide semiconductor layer comprises a crystal region which is c-axis-aligned perpendicularly to a surface of the oxide semiconductor layer, and wherein one of the source electrode and the drain electrode comprises a film comprising a metal having higher melting point than copper, and a copper film over the film.

34. The semiconductor device according to claim 33, wherein the oxide semiconductor layer comprises a first oxide semiconductor film and a second oxide semiconductor film over the first oxide semiconductor film.

35. The semiconductor device according to claim 33, wherein a channel width of the transistor is larger than a channel length of the transistor.

36. The semiconductor device according to claim 33,
wherein the first conductive layer comprises a first region, a second region adjacent to the first region, and a third region adjacent to the second region, the second region being interposed between the first region and the third region, wherein the first region does not overlap with the oxide semiconductor layer, the second region overlaps with the oxide semiconductor layer, and the third region does not overlap with the oxide semiconductor layer, and wherein a length of the second region in a direction perpendicular to an extending direction of the first conductive layer is shorter than a length of the first region in a direction perpendicular to the extending direction of the first conductive layer and shorter than a length of the third region in a direction perpendicular to the extending direction of the first conductive layer.

* * * * *